United States Patent
Deng et al.

(10) Patent No.: US 11,133,381 B2
(45) Date of Patent: Sep. 28, 2021

(54) REVERSE RECOVERY CHARGE REDUCTION IN SEMICONDUCTOR DEVICES

(71) Applicant: SEMICONDUCTOR COMPONENTS INDUSTRIES, LLC, Phoenix, AZ (US)

(72) Inventors: Shengling Deng, Chandler, AZ (US); Dean E. Probst, West Jordan, UT (US); Zia Hossain, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 88 days.

(21) Appl. No.: 15/959,479

(22) Filed: Apr. 23, 2018

(65) Prior Publication Data

US 2019/0326392 A1    Oct. 24, 2019

(51) Int. Cl.

| | |
|---|---|
| *H01L 29/06* | (2006.01) |
| *H01L 29/78* | (2006.01) |
| *H01L 29/739* | (2006.01) |
| *H01L 29/868* | (2006.01) |
| *H01L 29/66* | (2006.01) |
| *H01L 29/08* | (2006.01) |
| *H01L 29/10* | (2006.01) |

(52) U.S. Cl.
CPC ...... *H01L 29/0653* (2013.01); *H01L 29/0882* (2013.01); *H01L 29/1095* (2013.01); *H01L 29/6634* (2013.01); *H01L 29/66348* (2013.01); *H01L 29/66712* (2013.01); *H01L 29/7397* (2013.01); *H01L 29/7804* (2013.01); *H01L 29/7813* (2013.01); *H01L 29/868* (2013.01)

(58) Field of Classification Search
CPC ............. H01L 29/0653; H01L 29/0882; H01L 29/1095
See application file for complete search history.

(56) References Cited

U.S. PATENT DOCUMENTS

| | | | |
|---|---|---|---|
| 2004/0021173 A1* | 2/2004 | Sapp | H02M 3/1588 257/330 |
| 2005/0035402 A1* | 2/2005 | Venkatraman | H01L 21/823487 257/330 |

(Continued)

*Primary Examiner* — Thao X Le
*Assistant Examiner* — Xia L Cross
(74) *Attorney, Agent, or Firm* — Brake Hughes Bellermann LLP

(57) ABSTRACT

In a general aspect, a semiconductor device can include a semiconductor region of a first conductivity type and a well region of a second conductivity type. The well region can be disposed in the semiconductor region. An interface between the well region and the semiconductor region can define a diode junction at a depth below an upper surface of the semiconductor region. The semiconductor device can further include at least one dielectric region disposed in the semiconductor region. A dielectric region of the at least one dielectric region can have an upper surface that is disposed in the well region at a depth in the semiconductor region that is above the depth of the diode junction; and a lower surface that is disposed in the semiconductor region at a depth in the semiconductor region that is the same depth as the diode junction or below the depth of the diode junction.

10 Claims, 18 Drawing Sheets

(56) References Cited

U.S. PATENT DOCUMENTS

| | | | |
|---|---|---|---|
| 2006/0214222 A1* | 9/2006 | Challa | H01L 29/0661 |
| | | | 257/328 |
| 2012/0292692 A1* | 11/2012 | Lee | H01L 29/41766 |
| | | | 257/330 |
| 2016/0172482 A1* | 6/2016 | Bobde | H01L 29/66492 |
| | | | 257/330 |
| 2017/0005171 A1* | 1/2017 | Laforet | H01L 29/0696 |

* cited by examiner

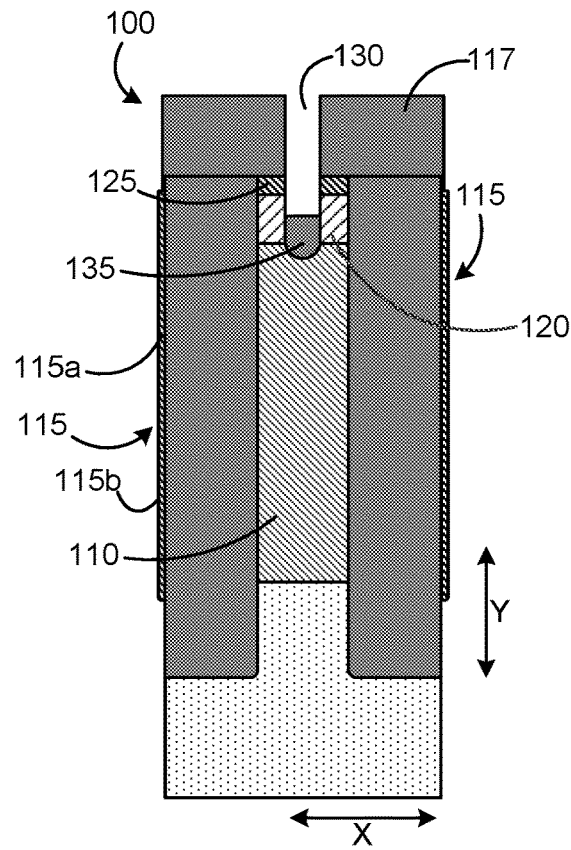
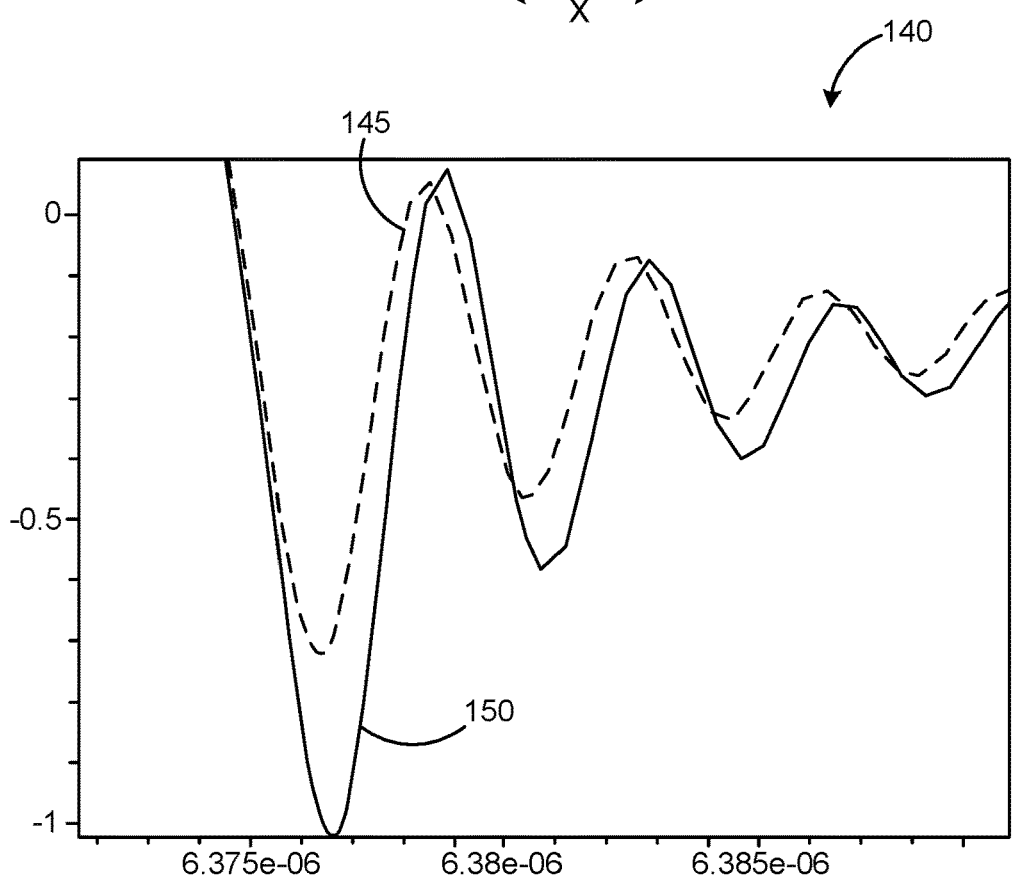
FIG. 1A
FIG. 1B

REVERSE RECOVERY CHARGE REDUCTION IN SEMICONDUCTOR DEVICES

TECHNICAL FIELD

This description relates to reduction of reverse recovery charge in semiconductor devices. More specifically, this disclosure relates to approaches for reducing junction area of a built-in diode in a semiconductor device to reduce reverse recovery charge.

BACKGROUND

Semiconductor device, such as metal-oxide-semiconductor field-effect transistors (MOSFETs), semiconductor rectifier (e.g., silicon rectifier) devices, and so forth, include one or more built-in diodes (e.g., P-N junctions, intrinsic diodes, etc.). For instance, a trench-gate MOSFET can include a built-in diode that is defined by a P-N junction between a body region or regions (e.g., a P-type well) of the MOSFET and a drift (or drain) region (e.g., an N-type epitaxial layer or substrate) of the MOSFET. Reverse recovery of the built-in diode occurs as part of switching the built-in diode of the MOSFET from a conduction state (e.g., an on state), where the P-N junction of the built-in diode is forward biased, to a non-conduction state (e.g., an off state), where the P-N junction of the built-in diode is reverse biased, which can be referred to as blocking mode (voltage blocking mode, etc.).

When switching from the on state to the off state, reverse recovery is a reverse current that flow across the P-N junction of the built-in diode (e.g. body-to-drift diode) in a trench-gate MOSFET (or in built-in diodes of other semiconductor devices) to remove minority carriers from both sides of the P-N junction (e.g., before the P-N junction has a sufficient depletion region to block a reverse current through the built-in diode, or across its PN-junction). The charge removed (holes diffused from the N-type region to the P-type region and electrons diffused from the P-type region to the N-type region) can be referred to as reverse recovery charge (Qrr).

The removal of Qrr during reverse recovery can result in switching losses in a MOSFET or other semiconductor device (e.g., due to lost charge, switching time increases, conduction losses, etc.). Further, reverse recovery can also result in signal voltage overshoot and ringing. In some instances, a P-N junction that has not fully reverse recovered within an expected time can cause system failures in an electronic system in which an associated semiconductor device (e.g., MOSFET etc.) is implemented.

Current approaches for reducing Qrr can require making significant trade-offs between reducing Qrr and other DC or AC parameters of an associated device, such as increasing leakage, reducing breakdown (blocking) voltage, etc. Further, current approaches for Qrr reduction can require making substantial changes in device architecture and/or semiconductor processing operations used to produce a given semiconductor device (e.g., such as a trench-gate MOSFET, a semiconductor rectifier, etc.), which can lead to increased design and process complexity, and increased overall cost.

SUMMARY

In a general aspect, a semiconductor device can include a semiconductor region of a first conductivity type and a well region of a second conductivity type. The well region can be disposed in the semiconductor region. An interface between the well region and the semiconductor region can define a diode junction at a depth below an upper surface of the semiconductor region. The semiconductor device can further include at least one dielectric region disposed in the semiconductor region. A dielectric region of the at least one dielectric region can have an upper surface that is disposed in the well region at a depth in the semiconductor region that is above the depth of the diode junction; and a lower surface that is disposed in the semiconductor region at a depth in the semiconductor region that is the same depth as the diode junction or below the depth of the diode junction.

In another general aspect, a metal-oxide-semiconductor field-effect transistor (MOSFET) can include a semiconductor region of a first conductivity type, the semiconductor region including a drift region of the MOSFET and a body region of a second conductivity type disposed in the semiconductor region. An interface between the body region and the semiconductor region can define a diode junction at a depth below an upper surface of the semiconductor region. The MOSFET can also include a source region of the first conductivity type disposed in the body region and a contact opening disposed in the semiconductor region. The contact opening can extend through the source region and terminate in the body region. The MOSFET can further include a dielectric region disposed at a bottom of the contact opening, the dielectric region can have a width that is less than a width of the bottom of the contact opening. The dielectric region can have an upper surface that is disposed in the contact opening at a depth in the semiconductor region that is above the depth of the diode junction, and a lower surface that is disposed in the semiconductor region at a depth in the semiconductor region that is the same depth as the diode junction or below the depth of the diode junction.

In another general aspect, a rectifier device can include a semiconductor region of a first conductivity type. The semiconductor region can include a cathode region of a P-intrinsic-N(P-i-N) diode of the rectifier device. The rectifier device can also include an anode region of a second conductivity type disposed in the semiconductor region. An interface between the anode region and the semiconductor region can define a diode junction at a depth below an upper surface of the semiconductor region. The rectifier device can further include at least one dielectric region disposed in the semiconductor region. A dielectric region of the least one dielectric region can extend through the anode region and terminate in the cathode region.

BRIEF DESCRIPTION OF THE DRAWINGS

FIG. 1A is cross-sectional diagram illustrating a portion of a trench-gate metal-oxide-semiconductor field-effect transistor (MOSFET) with a partially dielectric filled source contact.

FIG. 1B is a graph illustrating a comparison between reverse recovery charge (Qrr) of the device of FIG. 1A and Qrr of the device of FIG. 1A without the partial dielectric fill of the source contact.

Figure 2B:
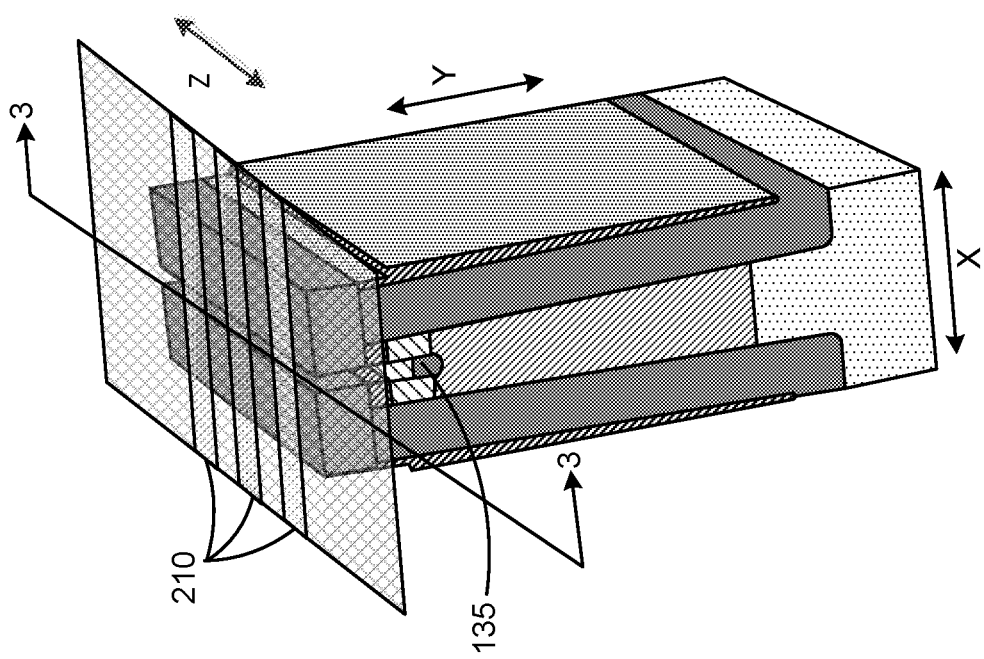
FIG. 2B is a three-dimensional isometric diagram that illustrates the portion of the MOSFET of FIG. 1A, and schematically illustrates a photolithography mask that can be used to segment the partial dielectric fill of the source contact.

Like reference symbols in the various drawings indicate like and/or similar elements. Elements shown in the various drawings are shown by way of illustration and may not necessarily be to scale. Further, scales of the various drawings may differ from one to another depending, at least in part, on the particular view being shown.

The reference characters in the various drawings are provided for purposes of illustration and discussion. Reference characters for like elements may not be repeated for similar elements in the same view. Also, reference characters shown in one view for a given element may be omitted for that element in related views. Also, reference characters for a given element that is shown in different views may not necessarily be discussed with respect to each of those views.

DETAILED DESCRIPTION

This disclosure is directed to approaches for reducing reverse recovery charge (Qrr) by reducing diode junction area (e.g., reducing an area of a P-N junction of a built-in diode of a semiconductor device), such as in a metal-oxide-semiconductor field-effect transistor (MOSFET), a rectifier, or other semiconductor device. More specifically, this disclosure is directed to approaches for reducing Qrr by partially cutting out portions of a P-N junction of a built-in diode, such as by filling (replacing, substituting, etc.) portions of the P-N junction with dielectric regions (dielectric islands dielectric areas, and so forth). In some implementations, a trench-gate MOSFET can include a built-in diode that can be defined by a P-N junction between a body region (e.g., a P-type well) of the MOSFET and a drift (or drain) region (e.g., an N-type epitaxial layer or substrate) of the MOSFET. In some implementations, a rectifier device can include a built-in diode that can be defined by a P-N junction between an anode region and a cathode region a P-intrinsic-N(P-i-N) diode included in the rectifier. Other semiconductor devices can also include built-in diodes in which the approaches described herein can be used to reduce Qrr of such built-in diodes.

In some implementations (e.g., implementations using the approaches described herein), reduction of Qrr can be proportional to an amount (e.g., percentage, portion, etc.) of the built-in diode junction (diode junction, P-N junction, and so forth) eliminated (replaced, dielectric filled, etc.). Further, the amount of a given diode junction that is replaced with dielectric can be precisely controlled via layout (design) of a given semiconductor device, which can facilitate accurate control of Qrr reduction in the given semiconductor device (and other semiconductor devices having built-in diodes).

In some implementations, the approaches described herein can be implemented in a semiconductor device (e.g., a MOSFET, a trench-gate MOSFET, a shielding gate MOSGET, a rectifier, etc.) without any changes to a basic structure (architecture) of the particular semiconductor device, or changes in doping profiles (e.g., epitaxial doping, body doping, cathode doping, anode doping, etc.) used in a semiconductor manufacturing process used to produce the semiconductor device. Further, as shown, for example, in FIGS. 6A-6F, 7A-7F, 8A-8E and 9A-9F, in some implementations, semiconductor devices can be produced (e.g., using the approaches described herein) with minor changes to (and/or addition of) semiconductor processing operations. Accordingly, the approaches described herein can be readily adapted for implementation across a number of semiconductor processing (manufacturing) platforms to facilitate achieving Qrr reduction in semiconductor devices produced using such processing platforms.

Further, the approaches described herein, in some implementations, can be implemented to reduce Qrr without significantly impacting other device performance parameters, such as breakdown voltage, switching time, etc.

FIG. 1A is cross-sectional diagram illustrating a portion of a trench-gate metal-oxide-semiconductor field-effect transistor (MOSFET) 100 with a partially dielectric filled source contact. The diagram shown in FIG. 1A is given by way of example and for purposes of illustration, e.g., to illustrate an implementation of reducing a junction area of a built in diode, so as to reduce Qrr of the corresponding MOSFET 100. Accordingly, for purposes of clarity, some elements, or portions of elements of the MOSFET 100 are not shown in FIG. 1A. The portion of the MOSFET 100 shown in FIG. 1A can be (e.g., a portion of) one active segment of a plurality of active segments of the MOSFET 100. In some implementations, a shield electrode (e.g., a gate shield electrode) can be included in the MOSFET 100, such as in the gate trench along with a gate electrode).

In FIG. 1A, as well as in subsequent drawings, axes (e.g., longitudinal axes) are shown that are referenced with respect to the illustrated implementations. The axes are illustrated by way of example, and to provide a consistent frame of reference for indicating the respective orientations various implementations and views shown in the drawings, alone or in comparison with each other. For instance, in FIG. 1A, an x-axis and a y-axis are shown. In the view of FIG. 1A, a z-axis (not shown) would be aligned in and out of the page. In other views and drawings included herein (e.g., FIGS. 3A-3C), a y-axis and a z-axis are shown. In these views, an x-axis (not shown) would be aligned in an out of the page of those views. These axes, while shown in a particular figure may, however, may not be specifically referenced in the discussion of that particular figure.

As shown in FIG. 1A, the MOSFET 100 includes a first semiconductor region (e.g., a first epitaxial layer, a heavily doped substrate, etc.) 105, a second semiconductor region (e.g., an epitaxial layer) 110, trench gates 115, body region(s) 120, source region(s) 125, a contact opening 130 and a dielectric region (a dielectric fill, a partial dielectric fill, a dielectric island, etc.) 135. In some implementations, the semiconductor region 105 can be of a first conductivity type, e.g., a heavily doped N+ or N++ semiconductor substrate (e.g., a silicon substrate, a silicon carbide substrate, a gallium arsenide substrate, etc.), or can be an epitaxial layer of the first conductivity type that is dispose on semiconductor substrate. The semiconductor region 110 can be of the first conductivity type, e.g., an N or N– epitaxial semiconductor layer. In some implementations, the semiconductor region 105 can be a first epitaxial layer and the semiconductor region 110 can be a second epitaxial layer, where the semiconductor region 110 has a heavier epitaxial layer than the semiconductor region 105. The semiconductor region 105 and the semiconductor region 110 (as well as any additional semiconductor layers, such as a heavily doped substrate in some implementations) can include (function as, define, etc.) a drift region and/or a drain region of the MOSFET 100.

The trench gates 115 of the MOSFET 100 (of which only portions of two trench gates 115 are shown) can each include a gate dielectric 115a and a conductive gate electrode 115b. For each trench gate 115, the gate dielectric 115a can be disposed on a sidewall and a bottom surface of a trench of the trench gate 115, while the conductive gate electrode 115b (e.g., a doped polysilicon electrode) can be disposed on the gate dielectric 115a. The gate dielectric 115a can electrically isolate (insulate, etc.) the gate electrode 115b from the semiconductor region 110, the body region 120 and the source region 125. Trench gates, such as the trench gates 115, are further illustrated in FIGS. 6A-9F.

The body region(s) 120 of the MOSFET 100 can be of a second conductivity type, e.g., a P-type implant, which can include a P body implant and/or a P+ heavy body implant (to which an ohmic contact can be formed with a source metal layer). The source region(s) 125, which are disposed in respective upper portions of the body region(s) 120, can be of the first conductivity type, e.g., an N+ source implant. As shown in FIG. 1A, the body region(s) 120 and the source region(s) 125 are disposed in the semiconductor region 110 and are adjacent to (e.g., directly adjacent to) respective trench gates 115 of the MOSFET 100. A voltage applied to the gate electrode 115b controls turn on of the MOSFET 110 (e.g., when a voltage above a threshold voltage is applied), and turn off of the MOSFET 110 (e.g., when a voltage below the threshold voltage is applied).

When the body (built-in) diode of the MOSFET 100 is turned on, the P-N junction of the built-in diode defined by an interface between the body region 120 and the semiconductor region 110 is forward biased, and current flows across that P-N junction. As shown in FIG. 1A, the P-N junction of the built-in diode (the interface between a bottom of the body region and the semiconductor region 110) can have a depth D along the Y-axis from an upper surface of the semiconductor region 110. The depth D can be in a range of 0.20 to 2.0 microns (μm). When the MOSFET 100 turns off, the built-in diode must reverse recover to remove the Qrr (minority carriers) of the built-in diode (e.g., holes in the semiconductor region and electrons in the body region) before the built in diode operates in blocking mode (e.g., before the MOSFET 100 has developed a sufficient depletion region to fully turn off).

As shown in FIG. 1A, the MOSFET 100 includes the dielectric region 135, which is disposed in a bottom (along a bottom surface, at a bottom, etc.) of the contact (source and body contact) opening 130, where the contact opening 130, in this implementation, is formed (e.g., using an etch process) through an inter-layer dielectric (ILD) 117, through the source region 125 and terminates in the body region 120. As shown in FIG. 1A, the dielectric 135, which can be formed from a thermally grown dielectric, e.g., a thermal oxide, and/or a deposited dielectric, e.g., a borosilicate glass (BSG). The ILD can also be formed using a number of approaches, such as using a thermally grown and/or deposited dielectric (e.g., oxide, glass, etc.).

As shown in FIG. 1A, the dielectric region 135 can have a width, along the x-axis, that is approximately 45% of a distance between the gate dielectrics 115a of the trench gates 115 (e.g., 45% of a width of the contact opening 130, where the contact opening can be from less than 0.1 μm to 2.0 μm or greater). In other words, the dielectric region 135 can partially fill (partially replace, interrupt, etc.) a portion (e.g., 45%) of the area of the P-N junction of the built in diode defined the interface between the (P-type) body region 120 and the (N-type) semiconductor region 110. This reduction in built-in diode junction area (as shown in FIG. 1B) results in a corresponding reduction in Qrr of the MOSFET 100 as compared to a MOSFET of the same dimensions as the MOSFET 100 without the partial dielectric fill (e.g., the MOSFET 100 without the dielectric region 135 shown in FIG. 1A). The dimensions of the contact opening 130, as well as other dimensions of the MOSFET 100, will depend, at least in part, on lithography limits of a semiconductor process used to produce the MOSFET 100.

FIG. 1B is a graph 140 illustrating a simulated comparison between reverse recovery current of the device of FIG. 1A (by a trace 145) and reverse recovery current of the device of FIG. 1A without the partial dielectric fill of the source contact (by a trace 150). That is, the trace 145 represents a device (e.g., the MOSFET 100) with approximately a 45% reduction in built-in diode junction area or the reverse-recovery charge Qrr (Qrr is the area under the reverse-recovery waveform), as compared to the device represented by the trace 150 (a device of the same structure and dimensions as the device represented by the trace 145 without the partial dielectric fill). In FIG. 1B, the horizontal axis (e.g., x-axis) indicates time in seconds (S), while the vertical axis (e.g., the y-axis) indicates current in amperes (A). As can be seen in FIG. 1B, trace 145 indicates a significant reduction in reverse-recovery current of the device of FIG. 1A, as compared with trace 150 for the device without the partial dielectric fill). In FIB. 1B, total Qrr for each trace 145 and 150 is the area under its respective trace, or a respective integral of current over time.

Figure 2A:
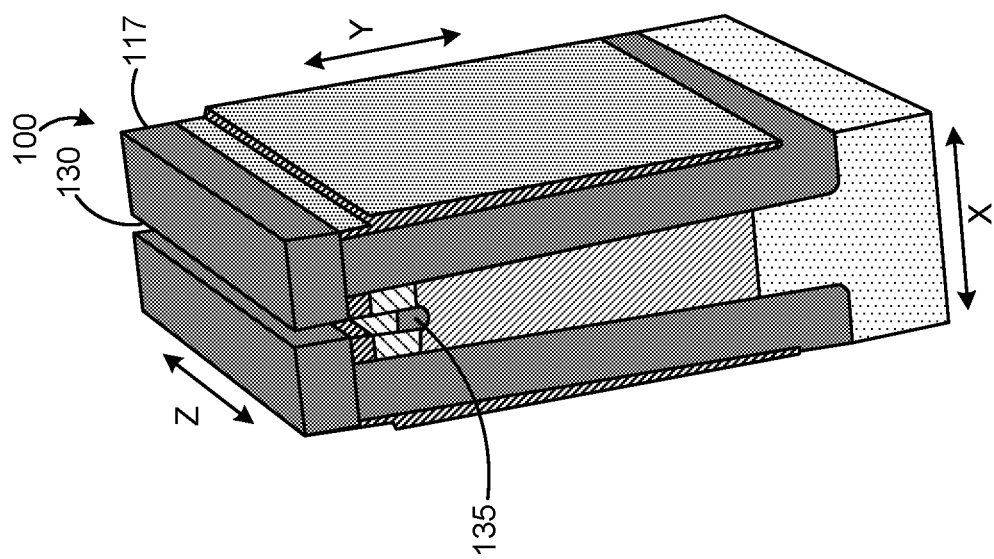
FIG. 2A is a three-dimensional isometric diagram that illustrates the portion of the MOSFET of FIG. 1A.

FIG. 2A is a three-dimensional isometric diagram that illustrates the portion of the MOSFET 100 shown in the cross-section of FIG. 1A. In FIG. 2A, the arrangement of the segment (portion) of the MOSFET 100 along the x-axis, the y-axis and the z-axis is shown. For instance, as illustrated in FIG. 2A, the contact opening 130 can extend longitudinally along the z-axis. In the implementation of FIG. 2A, the dielectric region 135 that is disposed at the bottom of the contact opening 130 can also extend along the z-axis along the bottom of the contact opening 130.

As shown in FIGS. 2A (and FIG. 1A), the dielectric region 135 can also extend vertically (along the Y-axis) from the body region 120 into the semiconductor region 110. In other words, the dielectric region 135 can extend across the P-N junction of the built-in diode defined by the interface between the body region 120 and the semiconductor region 110. Accordingly, the dielectric region 135 can partially fill (partially replace, partially remove, etc.) a portion of the built in diode junction (e.g., approximately 45% in this implementation) between the body region 120 and the semiconductor region 110, as compared to a MOSFET having the same dimensions as the MOSFET 100, but that does not include the dielectric region 135 (i.e., does not have a reduced built-in diode junction area). As described herein, this reduction in built-in diode junction area can reduce Qrr and improve reverse recovery performance of the MOSFET 100 without significantly impacting other performance parameters of the MOSFET 100.

FIG. 2B is a three-dimensional isometric diagram that illustrates the portion of the MOSFET 100 of FIGS. 1A and 2A, and also schematically illustrates a photolithography mask 200 that can be used to segment the partial dielectric fill of the source contact. As shown in FIG. 2B, the mask 200 can include a plurality of stripes 210 (e.g., photomask features) that can be used to photolithographically define segments of the dielectric region 135. As further illustrated in FIGS. 3A-3C, such segments of the dielectric region 135 can alternate with portions of the body region 120 along the bottom of the contact opening 130. In other words, the segments of the dielectric region 135 and the segments of the body region 120 can be linearly arranged along the z-axis and along the bottom of the contact opening 130.

Figure 3A:
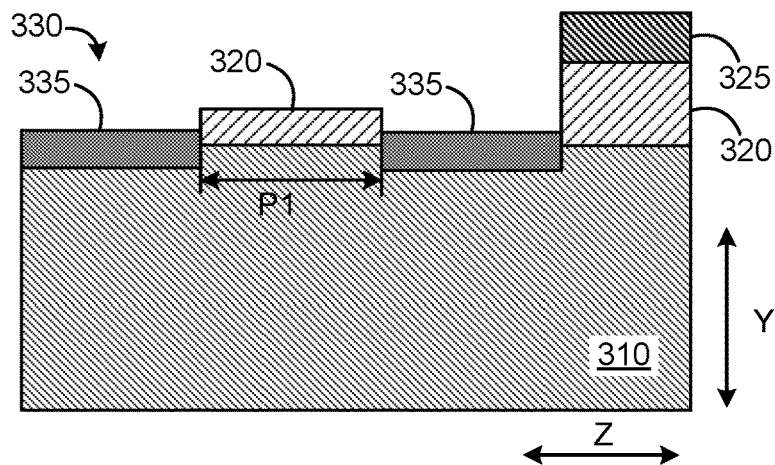
FIGS. 3A-3C are cross-sectional diagrams illustrating partially dielectric filled MOSFET source contacts with different segment pitches.
Figure 3B:
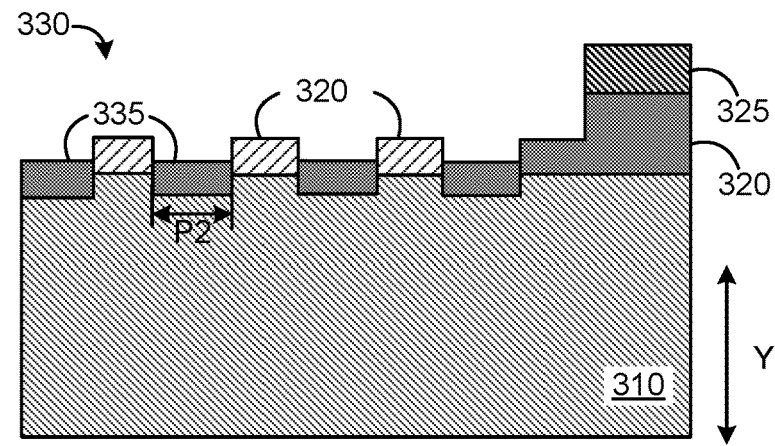
Figure 3C:
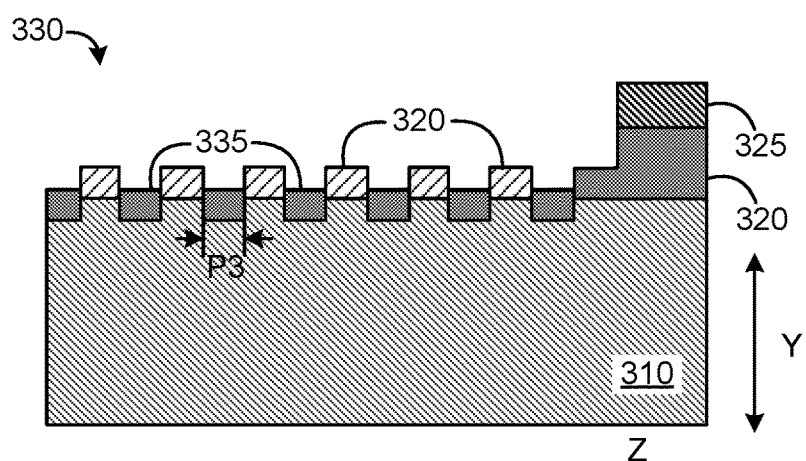

FIGS. 3A-3C are cross-sectional diagrams illustrating partially dielectric filled MOSFET source contacts with different segment pitches. The drawings shown in FIGS. 3A-3C are cross-sectional views of example implementations that can be included in the MOSFET 100. For instance, the cross-sectional view in FIGS. 3A-3C can be taken along the z-axis shown in FIGS. 2A and 2B, and through the contact opening 130, such as shown by the section line 3-3 in FIG. 2B. For purposes of illustration and clarity, the same reference numbers are used in each of FIGS. 3A-3C, where each implementation includes a semiconductor region 310 (e.g., an N-type epitaxial layer), body region segment(s) 320 (e.g., P-type body and/or heavy body region segments), a source region 325 (e.g., an N+ source region), and dielectric region segments 335.

Each of the drawings of FIGS. 3A-3C illustrates an implementation with approximately 50% reduction in junction area of a built-diode of the MOSFET 100 (as compared to the MOSFET 100 without partial dielectric fill), with different segment pitches for the dielectric region segments 335 and/or the body region segments 320. In some implementations, the arrangements shown in FIGS. 3A-3C can be implemented in other semiconductor devices, such as rectifier devices.

As shown in FIGS. 3A-3C, the contact opening 330 can have, along its bottom, a plurality of body region segments 320 that alternate with a plurality of dielectric region segments 335. While the body region segments 320 and the dielectric segments 335 are shown as having a same length (along the z-axis) for each respective implementation of FIGS. 3A-3C, in some implementations, different lengths can be used for the body region segments 320 and the dielectric segments 335, or different lengths can be used for each of the segments (whether body region or dielectric region segments).

Referring to the example implementations of FIGS. 3A-3C, each of the body region segments 320 in FIG. 3A can having a length P1 along the z-axis of X to Y, Each of the body region segments in FIG. 3B can having a length P2 along the z-axis of A to B. Further, each of the body region segments in FIG. 3C can having a length P3 along the z-axis of C to D. In some implementations, other lengths can be used for one or more of the body region segments 320 and or the dielectric region segments 335. That is, in some implementations, the body region segments 320, as well as the dielectric region segments 335, can each have different lengths. For instance, in some implementations, dimensions for P1, P2 and P3 can be in a range from 1 µm, or less, to 10 µm, or more.

Figure 4:
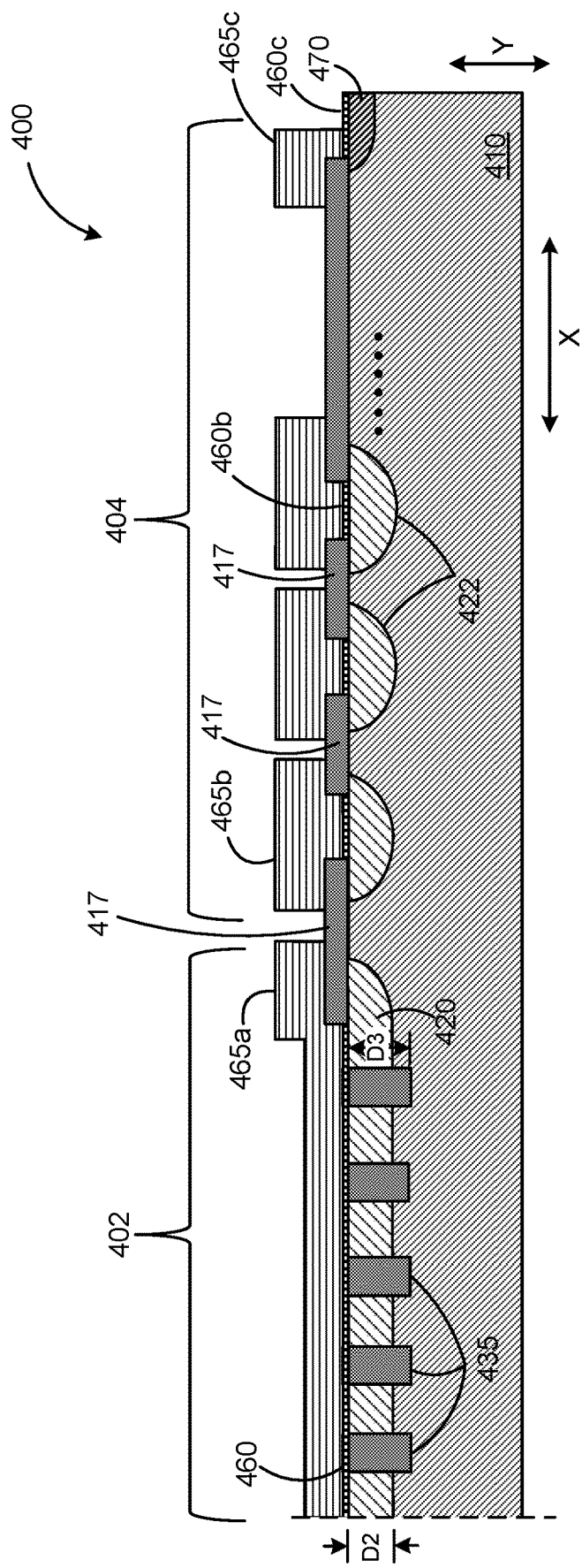
FIG. 4 is cross-sectional diagram illustrating a rectifier that includes a partially dielectric filled anode region.

FIG. 4 is cross-sectional diagram illustrating a rectifier (semiconductor) device 400 that includes a partially dielectric filled anode region. As shown in FIG. 4, the rectifier 400 includes an active area 402 and a termination area 404 that are produced (disposed, included, etc.) in a semiconductor region 410 (which can include an N-type epitaxial layer and/or N-type semiconductor substrate). In some implementations, the rectifier can also include a backside (e.g., on a bottom surface of the rectifier 400) a metal layer (not shown) that acts as a low-resistance cathode contact for the rectifier 400. In the rectifier 400 shown in FIG. 4, the semiconductor region 410 can define a cathode region of a P-i-N (e.g., built-in) diode of the rectifier 400.

As shown in FIG. 4, the active area 402 of the rectifier 400 can include a well region 420 (which can be formed using a P+ implant). The well region 420 can be included in (e.g., define, act as, etc.) an anode of the P-i-N diode of the rectifier 400, where a P-N junction of the P-i-N diode is disposed at a depth D2 (along the y-axis) below an upper surface of the semiconductor region 410. The active area 402 also includes dielectric filled trenches 435 disposed in the well region 400, where the dielectric trenches can replace (partially replace, partially fill, interrupt, etc.) the P-N junction between the well (anode) region 420 and the semiconductor (cathode) region 410. In some implementations, the filled dielectric regions can also be formed in Schottky rectifier junction without a P-N junction.

For instance, each of the dielectric filled trenches 435, as shown in FIG. 4, can extend through the well region 420 and terminate in the semiconductor region 410 at a depth D3 from the surface of the semiconductor region, where D3 is below (deeper) that the depth D1 of the P-N junction defined by the interface between the well region 420 and the semiconductor region 410. That is, the dielectric filled trenches 435 can each extend through and interrupt (replace, partially fill, etc.) a portion of the P-N junction between the well region 420 and the semiconductor region 410, which, as described herein, can reduce an associated Qrr as compared to a rectifier of the same structure and dimensions (as the rectifier 400), without the oxide filled trenches 435 filling (replacing, etc.) portions of the P-N junction.

As shown in FIG. 4, the rectifier 400, in the active region 402, can also include a barrier metal layer 460a that is disposed on an upper surface of the well region 420 and upper surfaces of the oxide filled trenches 435. An anode metal (e.g., aluminum) layer 465a can be disposed on an upper surface of the barrier metal layer 460a.

As further illustrated in FIG. 4, the termination region 404 can include floating (e.g., P+) guard rings 422 and a channel stop (e.g., N+) implant 470. In the termination region 404, a barrier metal layer 460b can be disposed on upper surfaces of the floating guard rings 422 and a guard ring metal (e.g., aluminum) layer 465b can be disposed on the barrier metal layer 460b. Also in the termination region 404, a barrier metal layer 460c can be disposed on an upper surface of the channel stop implant 470, and a channel stop metal (e.g., aluminum) layer 465c can be disposed on the barrier metal layer 460c. As further illustrated in FIG. 4, an ILD layer 417 can be included to provide electrical isolation between elements of the rectifier 400.

FIGS. 5A-5D are diagrams illustrating plan views of various patterns for partial dielectric filling of a built-in diode junction to reduce Qrr of an associated semiconductor device. In some implementations, the patterns shown in FIGS. 5A-5D can be used in MOSFETs, such as the MOSFET 100, in rectifiers, such as the rectifier 400, or in other semiconductor devices. The patterns illustrated in FIGS. 5A-5D are given by way of example, and other patterns, combinations of these patterns, or other arrangements of dielectric regions used to partially fill (replace, etc.) portions of a P-N junction of a built-in diode to achieve (realize, affect, etc.) a corresponding reduction in Qrr are possible. The specific pattern, arrangement and structure of such dielectric fill regions will depend on the particular implementation, such as the particular type of semiconductor device in which the dielectric fill regions are included.

Figure 5A:
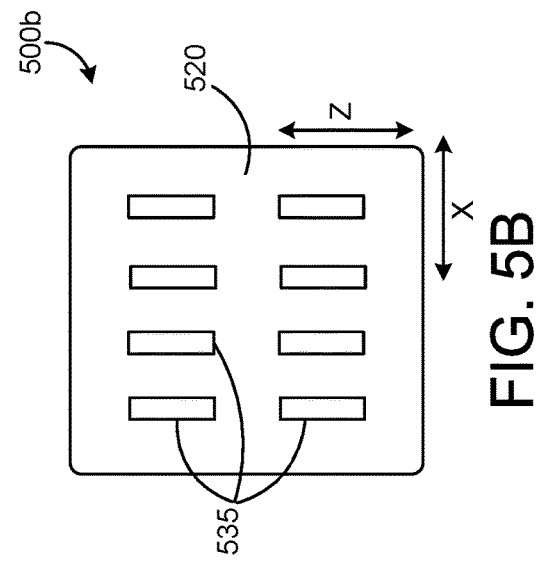
FIGS. 5A-5D are diagrams illustrating plan views of various patterns for partial dielectric filling of a built-in diode junction.
Figure 5B:
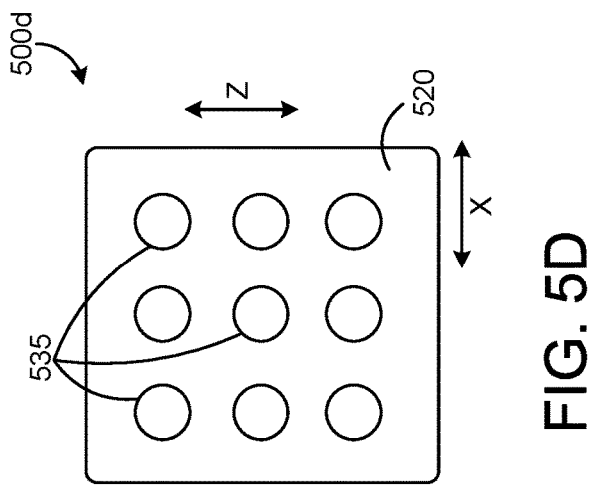
Figure 5C:
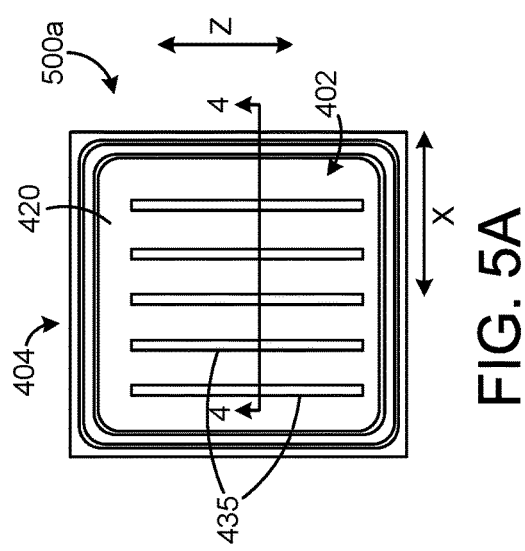

FIG. 5A is a plan diagram of a semiconductor device 500a in which the rectifier 400 can be implemented. Accordingly, the same reference numbers from FIG. 4 are used to reference the elements in FIG. 5A. For instance, the device 500a includes the active region 402 and the termination region 404 of the rectifier 400. As shown in FIG. 5A, the active region 420 includes the well (anode) region 420 and the dielectric filled trenches 435, which are, in this example, arranged as stripes along the z-axis. In other implementations, other arrangements of the dielectric filled trenches 435 is possible, such as those shown in FIGS. 5B-5C, as some examples. In the examples of FIGS. 5B-5C, like reference numbers are used to refer to like, or similar elements.

FIG. 5B is a plan diagram of a semiconductor device 500b, which can, in some implementations, be used to implement a MOSFET, a rectifier, or other semiconductor device. As shown in FIG. 5B, the device 500b includes a well (e.g., body, anode, etc.) region 520 and dielectric (fill) regions 535, which are shown in a segmented stripe arrangement (e.g., segmented along the z-axis), such in the arrangements discussed above with respect to FIGS. 3A-3C.

FIG. 5C is a plan diagram of a semiconductor device 500c, which can, in some implementations, be used to implement a MOSFET, a rectifier, or other semiconductor device. As shown in FIG. 5C, the device 500c includes the well (e.g., body, anode, etc.) region 520 and the dielectric (fill) regions 535 are shown in a segmented (along the z-axis) arrangement. Further, the dielectric regions 535 of the device 500c are also arranged in an interstitial (e.g., staggered) pattern.

Figure 5D:
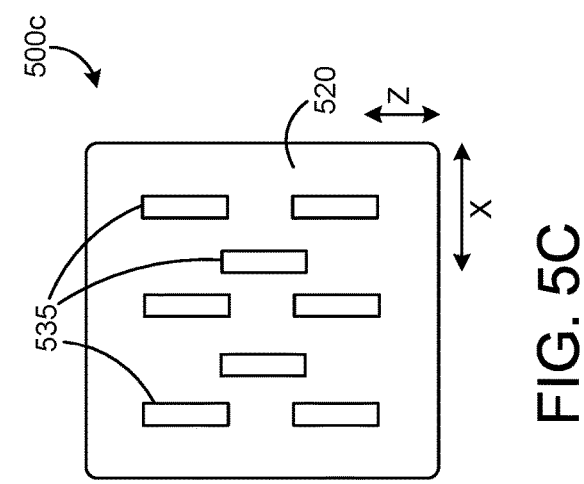

FIG. 5D is a plan diagram of a semiconductor device 500d, which can, in some implementations, be used to implement a MOSFET, a rectifier, or other semiconductor device. As shown in FIG. 5d, the device 500d includes the well (e.g., body, anode, etc.) region 520 and the dielectric (fill) regions 535 are shown as an array of circular columns (dielectric regions). In some implementations, the circular dielectric regions of FIG. 5D could be arranged in an interstitial (e.g., staggered) pattern, similar to the pattern of dielectric regions 535 in FIG. 5C.

FIGS. 6A-6F, 7A-7F, 8A-8E and 9A-9F illustrate semiconductor processing flows (e.g., semiconductor processes operation sequences) of example implementations for producing a partially dielectric filled MOSFET source contact to reduce junction area of a built-in diode and achieve a corresponding reduction in Qrr of a semiconductor device. The approaches discussed with respect to FIGS. 6A-9E are described by way of example, and for purposes of illustration with respect to producing trench gate MOSFET devices, such as the MOSFET 100 described above. In some implementations, the approaches illustrated in FIGS. 6A-9F can be used to perform partial dielectric filling of a P-N junction of a built-in diode in other semiconductor devices, such as a rectifier, for example. Further, the process operations of FIGS. 6A-9F can be included in a number semiconductor processing platforms, which can each include a number of semiconductor processing operations that occur before the illustrated operations, as well as a number of semiconductor processing operations that occur after the illustrated operations. As the device shown in FIGS. 6A-9F are similar to the MOSFET devices discussed above, the specific details of at least some elements of those devices are not repeated again here.

Figure 6A:
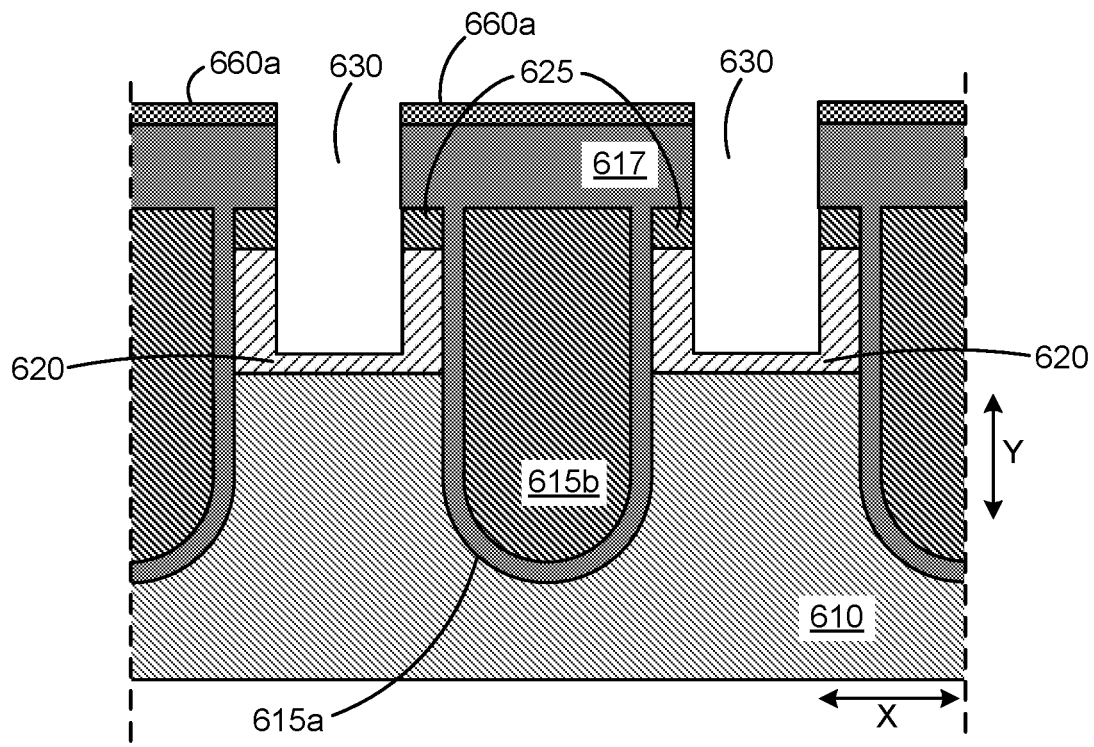
FIGS. 6A-6F are cross-sectional diagrams illustrating a semiconductor process (e.g., process operations) for producing a partially dielectric filled MOSFET source contact.

FIGS. 6A-6F are cross-sectional diagrams illustrating operations of a semiconductor process (e.g., processing operations, semiconductor processing operations, etc.) for producing a partially dielectric filled MOSFET source contact, so as to reduce a junction area of a built-in diode (e.g., defined by an interface between a P-type body region and an N-type semiconductor region). Referring to FIG. 6A, prior semiconductor processing operations have been performed to produce the structure shown. As shown in FIG. 6A, the resulting (in-process) MOSFET includes a semiconductor region 610 (e.g., an N-type epitaxial layer that can be disposed on an N-type semiconductor substrate).

The illustrated MOSFET of FIG. 6A also includes trench gates 615 (each including a gate dielectric 615a and a conductive gate electrode 615b), an ILD layer 617, body (P-type well) regions 620, source (N-type) regions 625 and contact openings 630. In some implementations, the contact openings 630 can be etched (e.g., using an isotropic etch) through a hard mask 660a (which can be, e.g., a nitride hard mask, a photoresist mask, etc.). As shown in FIG. 6A, the contact openings 630 can extend through the ILD 617, respective source regions 625 and terminate in respective body regions 620 of the illustrated MOSFET.

Figure 6B:
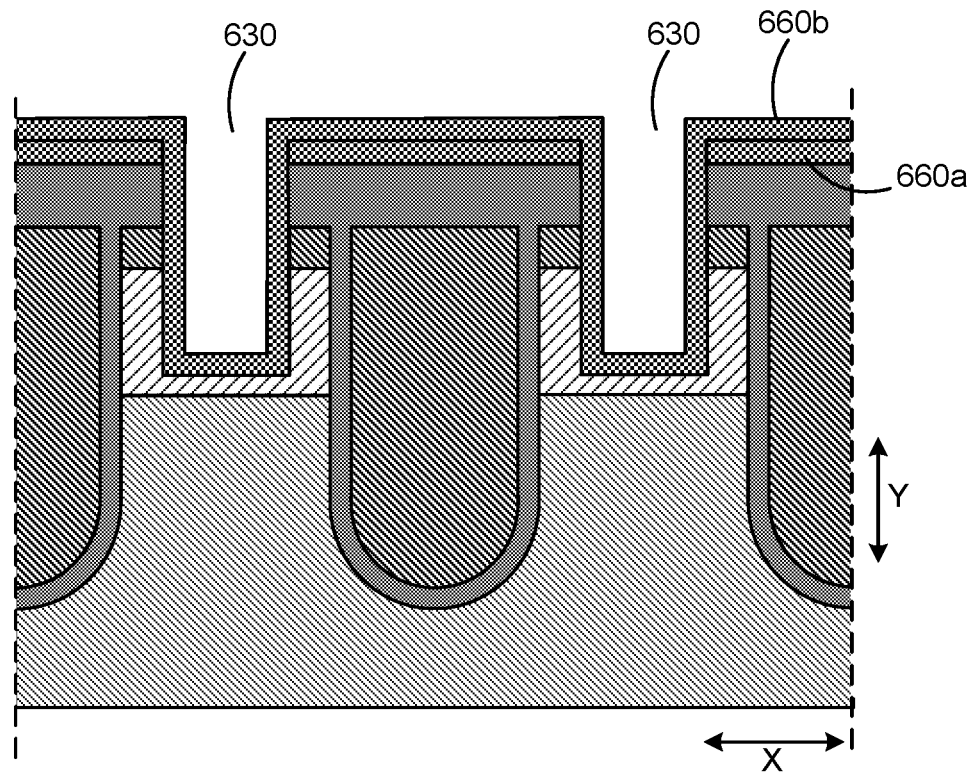
Figure 6C:
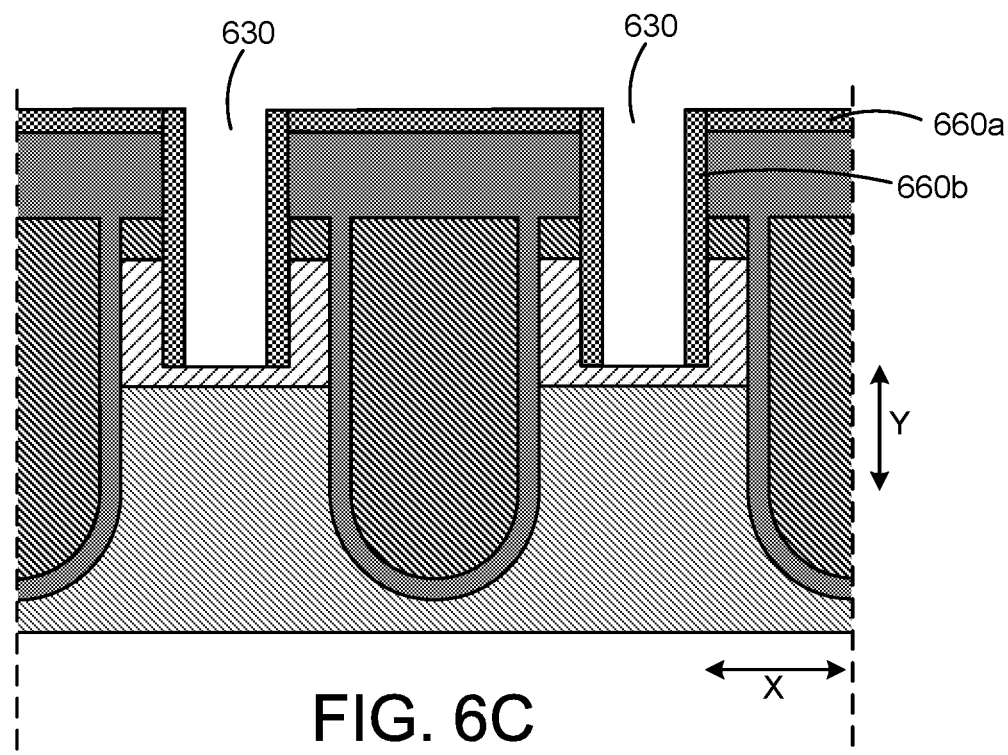

As shown in FIG. 6B, another masking (e.g., nitride) layer 660b can be deposited on the structure of FIG. 6A, including on an upper surface of the masking layer 660a, sidewalls of the contact openings 630 and bottoms (bottom surfaces) of the contact openings 630. As shown in FIG. 6C, an etch process (e.g., an anisotropic etch process) can be performed on the structure shown in FIG. 6B, which can remove the masking (e.g., nitride) layer 660b from the bottoms of the contact openings 630 and the upper surfaces of the masking layer 660a, leaving portions of the masking layer 660b disposed on the sidewalls of the contact openings 630.

Figure 6D:
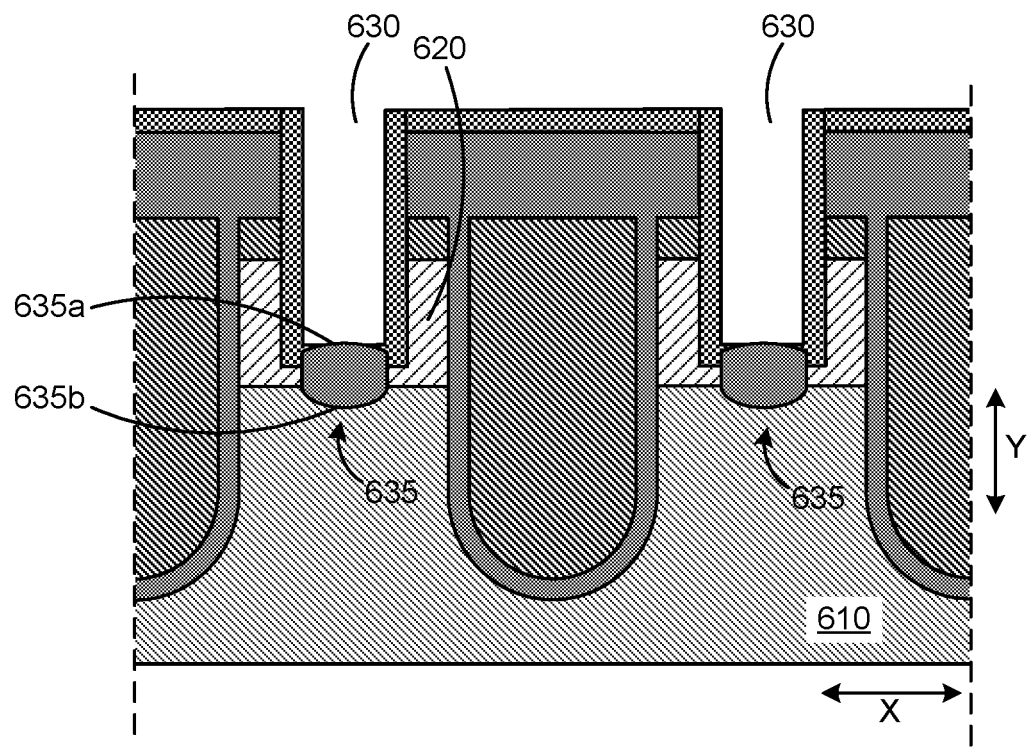

As illustrated in FIG. 6D, a local oxidation of silicon (LOCOS) process can be performed on the structure illustrated in FIG. 6C to form respective dielectric (LOCOS) regions 635 (dielectric fill regions) at the bottoms of the contact openings 630. During the LOCOS process, the portions of the masking layer 660b that are disposed on the sidewalls of the contact openings 630 prevent oxidation of the source regions 625 and the body (well) regions 620. As shown in FIG. 6D, the dielectric regions 635 replace (fill, interrupt, intersect, etc.) at least a portion of the P-N junction of a corresponding built-in diode defined by an interface between the body (well) region 620 and the semiconductor region 610.

As also shown in FIG. 6D, each dielectric region 635 can have an upper surface 635a that is disposed above (vertically above) a P-N junction of a respective built in diode, and a bottom surface 635b that is below the P-N junction of the respective built-in diode. In other words, the upper surface 635a can be disposed at a depth below an upper surface of the semiconductor region 610 that is less than a depth of the P-N junction of the built in diode (e.g., the depth D in FIG. 1A), while the bottom surface 635b can be disposed at a depth below an upper surface of the semiconductor region 610 that is greater than the depth (e.g., the depth D) of the P-N junction of the built in diode. That is, each dielectric region 635 can extend through the P-N junction of a respective built-in diode, such that a portion of (part of an area of, etc.) the respective P-N junction is replaced (filled, interrupted, etc.) by the dielectric region 635.

Figure 6E:
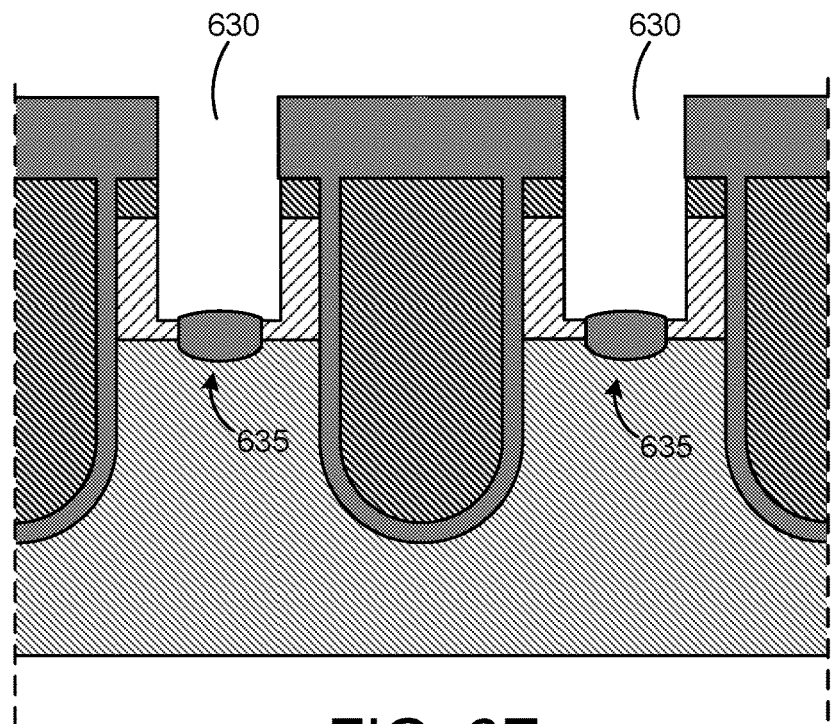
Figure 6F:
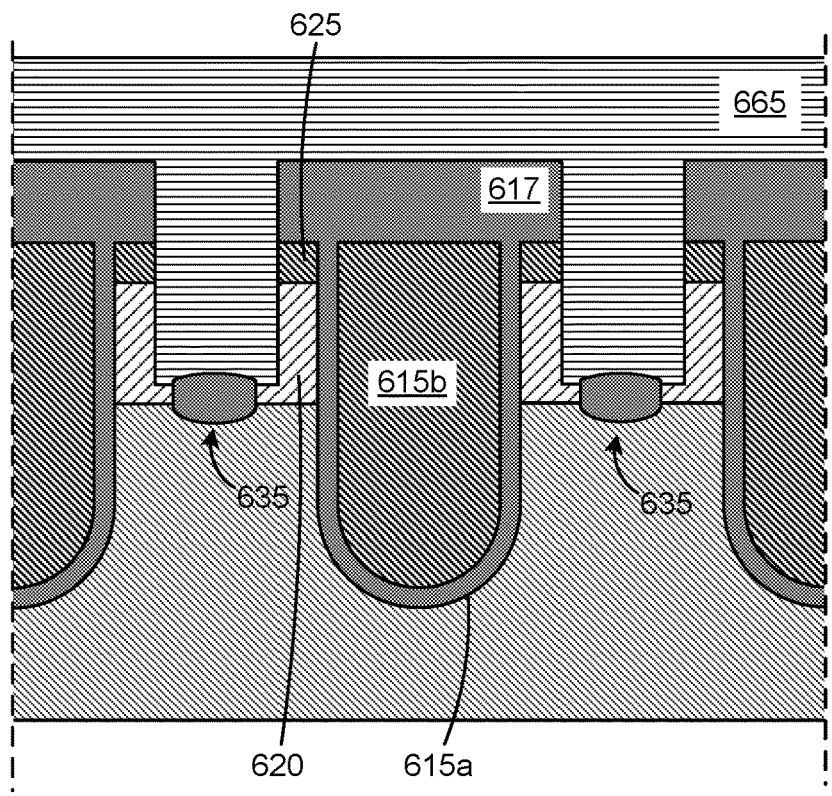

As shown in FIG. 6E, an etch process (e.g., an isotropic etch process) can be performed on the structure shown in FIG. 6D to remove the remaining portions of the masking layers 660a and 660b. As shown in FIG. 6F, a metal deposition process can be performed on the structure shown in FIG. 6E to form a source metal (e.g., aluminum) layer 665 that is disposed in the contact openings 630 and on an upper surface of the ILD layer 617. As illustrated in FIG. 6F, the source metal layer 665 can electrically contact the body regions 620 and the source regions 625, such as along the sidewalls of the contact openings 630 and on the bottom of the contact openings 630, e.g., on each side of the dielectric regions 635, such as shown in FIG. 6F.

Figure 7A:
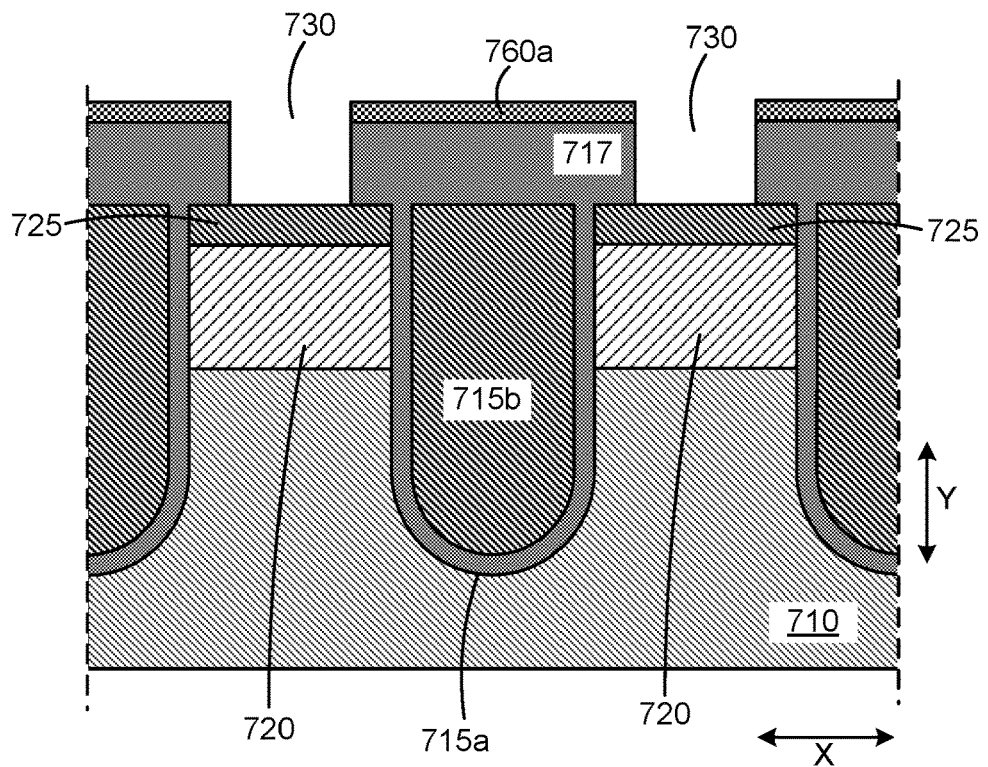
FIGS. 7A-7F are cross-sectional diagrams illustrating another semiconductor process (e.g., process operations) for producing a partially dielectric filled MOSFET source contact.

FIGS. 7A-7F are cross-sectional diagrams illustrating operations of a another semiconductor process (e.g., processing operations, semiconductor processing operations, etc.) for producing a partially dielectric filled MOSFET source contact, so as to reduce a junction area of a built-in diode (e.g., defined by an interface between a P-type body region and an N-type semiconductor region). Referring to FIG. 7A, prior semiconductor processing operations have been performed to produce the structure shown. As shown in FIG. 7A, the resulting (in-process) MOSFET includes a semiconductor region 710 (e.g., an N-type epitaxial layer that can be disposed on an N-type semiconductor substrate).

The illustrated MOSFET of FIG. 7A also includes trench gates 715 (each including a gate dielectric 715a and a conductive gate electrode 715b), an ILD layer 717, body (P-type well) regions 720, source (N-type) regions 725 and contact openings 730. In some implementations, the contact openings 730 can be etched (e.g., using an isotropic etch) through a hard mask 760a (which can be, e.g., a nitride hard mask, a photoresist mask, etc.). As shown in FIG. 7A, as compared with FIG. 6A, in which the contact openings 630 terminated in the body regions 620, the contact openings 730, in FIG. 7A extend only through the ILD 717 and terminate at respective upper surfaces of the source regions 720 (e.g., an upper surface of the semiconductor region 710 vertically above respective source regions 725 and body regions 720).

Figure 7B:
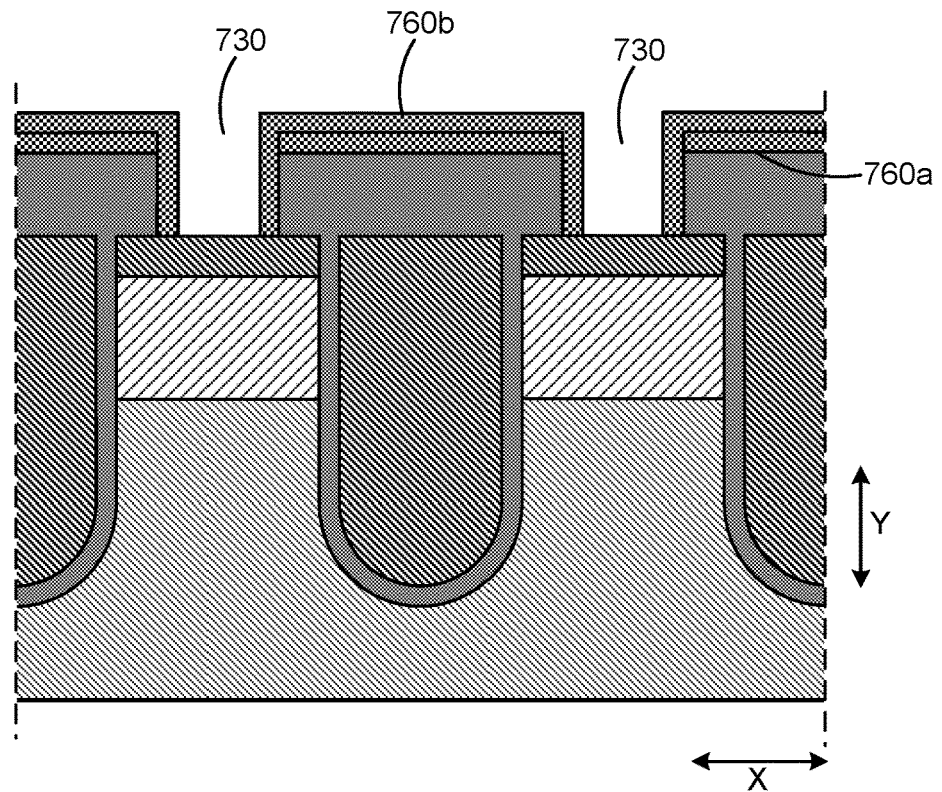

As shown in FIG. 7B, another masking (e.g., nitride) layer 760b can be deposited on the structure of FIG. 7A, including on an upper surface of the masking layer 760a and sidewalls of the contact openings 730. Forming the structure shown in FIG. 7B can also include performing an (anisotropic) etch process, such as described above with respect to FIG. 6C, e.g., to remove the making layer 760b from bottoms (bottom surfaces) of the contact openings 730 in FIG. 7B.

Figure 7C:
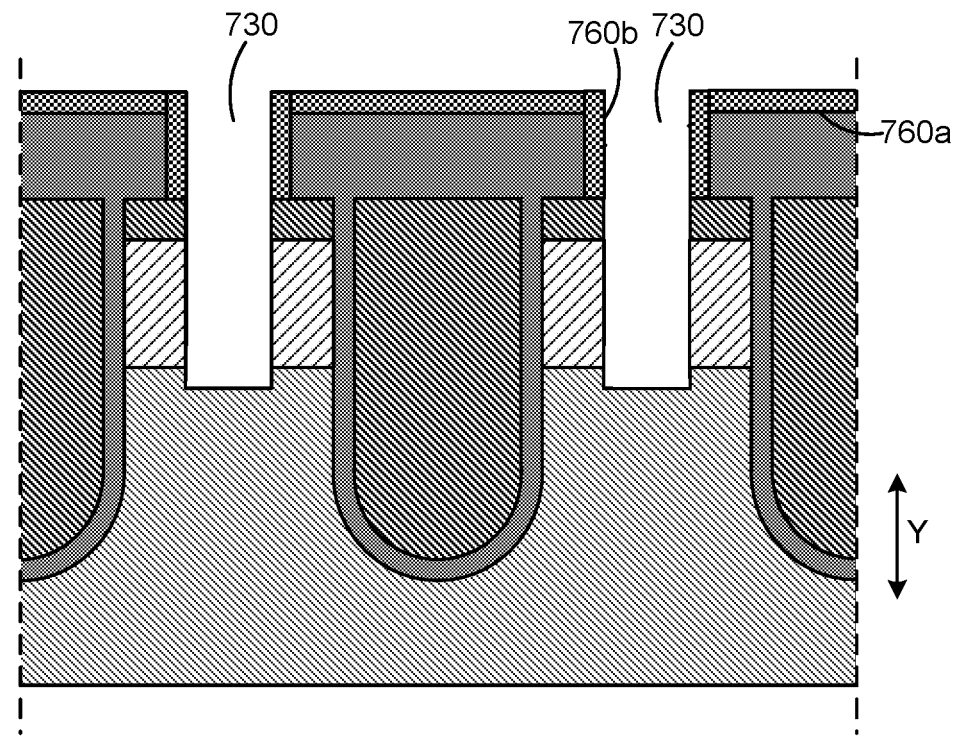

As shown in FIG. 7C, an etch process (e.g., an anisotropic etch process) can be performed on the structure shown in FIG. 7B, e.g., to extend the contact openings 730 through the respective source regions 725, and through the respective body regions 720, such that the contact openings 730 terminate in the semiconductor region 710 below the respective body regions 720, as shown in FIG. 7C.

Figure 7D:
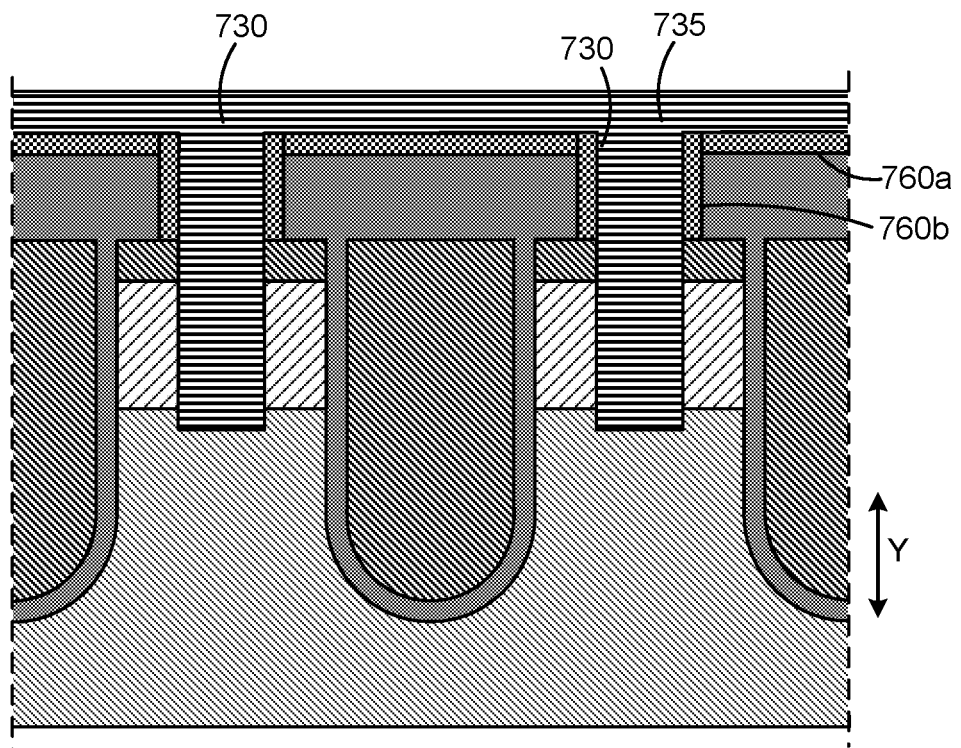
Figure 7E:
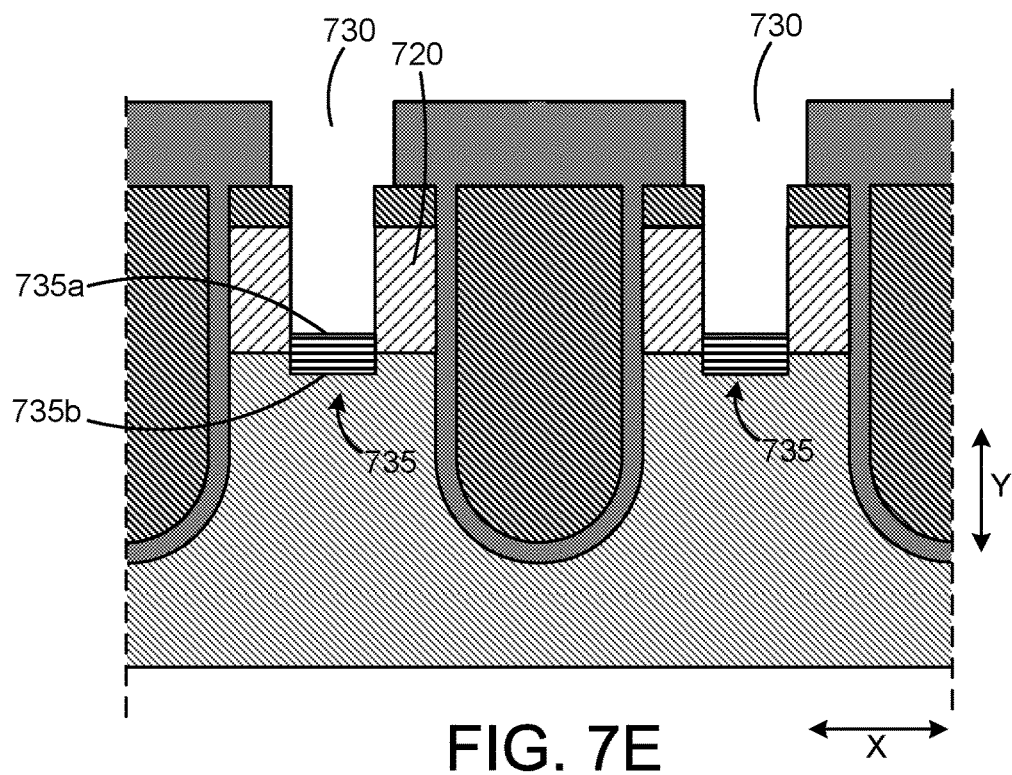

As illustrated in FIG. 7D, a dielectric (e.g., oxide) deposition process can be performed on the structure illustrated in FIG. 7C to form a dielectric fill layer 735, which can, as shown in FIG. 7D, fill the contact openings 730 and be disposed on an upper surface of the ILD 717. As shown in FIG. 7E, an etch process (e.g., an anisotropic etch process) can be performed to remove a portion of the dielectric fill layer 735 and the masking layers 760a and 760b, such that, in this example, only respective dielectric fill layer regions 735 remain at the bottoms of the contact openings 730, such as shown in FIG. 7E. As also illustrated in FIG. 7E, each of the dielectric regions 735 can replace (fill, interrupt, intersect, etc.) at least a portion of the P-N junction of a respective built-in diode defined by an interface between a respective body (well) region 720 and the semiconductor region 710.

As also shown in FIG. 7E, each dielectric region 735 can have an upper surface 735a that is disposed above (vertically above) a P-N junction of a respective built in diode, and a bottom surface 735b that is below the P-N junction of the respective built-in diode. In other words, the upper surface 735a can be disposed at a depth below an upper surface of the semiconductor region 710 that is less than a depth of the P-N junction of the built in diode (e.g., the depth D in FIG. 1A), while the bottom surface 735b can be disposed at a depth below an upper surface of the semiconductor region 710 that is greater than the depth (e.g., the depth D) of the P-N junction of the built in diode. That is, each dielectric region 735 can extend through the P-N junction of a respective built-in diode, such that a portion of (part of an area of, etc.) the respective P-N junction is replaced (filled, interrupted, etc.) by the dielectric region 735.

Figure 7F:
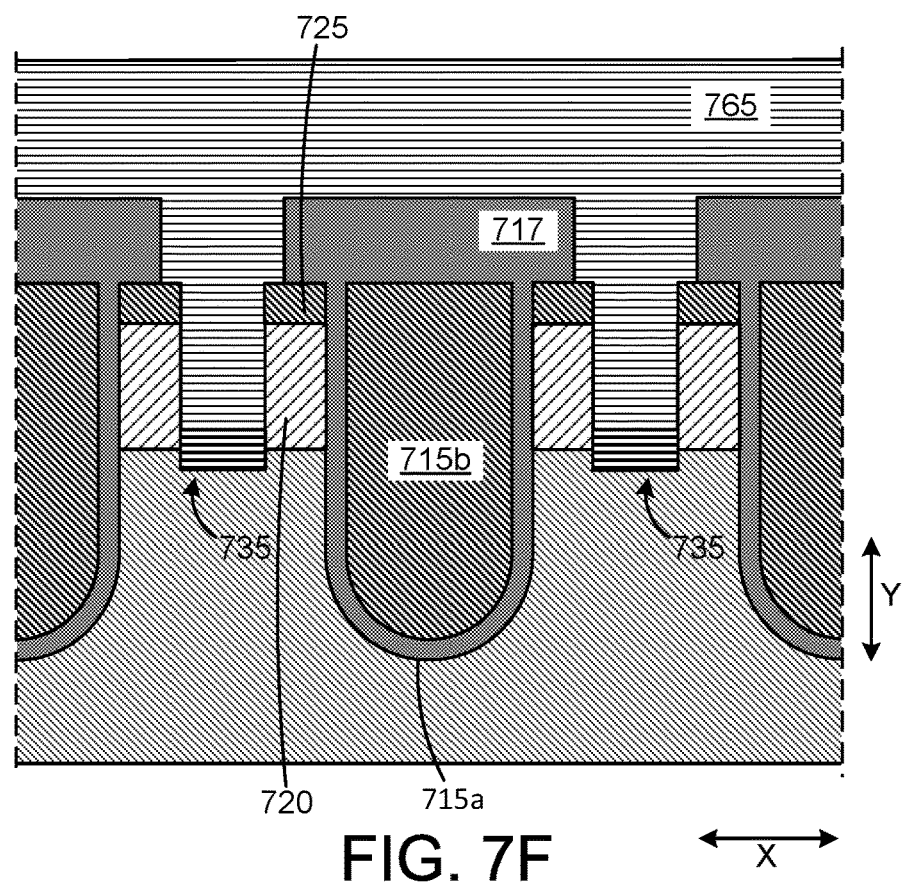

As shown in FIG. 7F, a metal deposition process can be performed on the structure shown in FIG. 7E to form a source metal (e.g., aluminum) layer 765 that is disposed in the contact openings 730 and on an upper surface of the ILD layer 717. As illustrated in FIG. 7F, the source metal layer 765 can electrically contact the body regions 720 and the source regions 725, such as along the sidewalls of the contact openings 730 and on the bottom of the contact openings 730, e.g., on each side of the dielectric regions 735, such as shown in FIG. 7F.

Figure 8A:
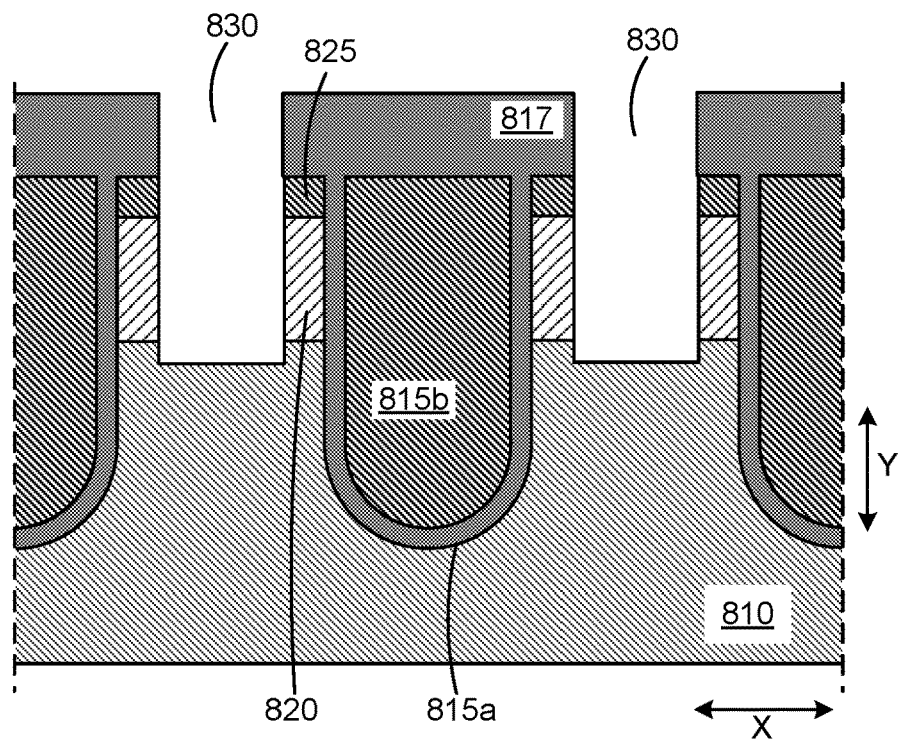
FIGS. 8A-8E are cross-sectional diagrams illustrating yet another semiconductor process (e.g., process operations) for producing a partially dielectric filled MOSFET source contact.

FIGS. 8A-8E are cross-sectional diagrams illustrating operations of a another semiconductor process (e.g., processing operations, semiconductor processing operations, etc.) for producing a partially dielectric filled MOSFET source contact, so as to reduce a junction area of a built-in diode (e.g., defined by an interface between a P-type body region and an N-type semiconductor region). Referring to FIG. 8A, prior semiconductor processing operations have been performed to produce the structure shown. As shown in FIG. 8A, the resulting (in-process) MOSFET includes a semiconductor region 810 (e.g., an N-type epitaxial layer that can be disposed on an N-type semiconductor substrate).

The illustrated MOSFET of FIG. 8A also includes trench gates 815 (each including a gate dielectric 815a and a conductive gate electrode 815b), an ILD layer 817, body (P-type well) regions 820, source (N-type) regions 825 and contact openings 830. In some implementations, the contact openings 830 can be etched (e.g., using an isotropic etch) through a hard mask, such as discussed herein. As shown in FIG. 8A, similar to the structure shown in FIG. 7C, the contact openings 830 extend through the ILD 817, through the respective source regions 825, and through the respective body regions 820, such that the contact openings 830 terminate in the semiconductor region 810 below the respective body regions 820, as shown in FIG. 8A.

Figure 8B:
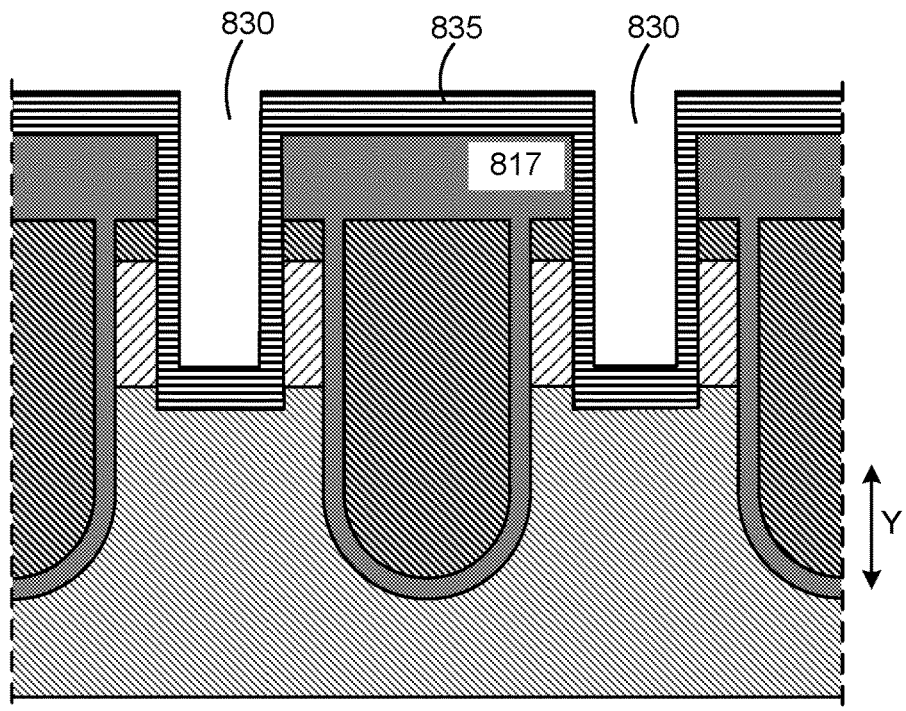
Figure 8C:
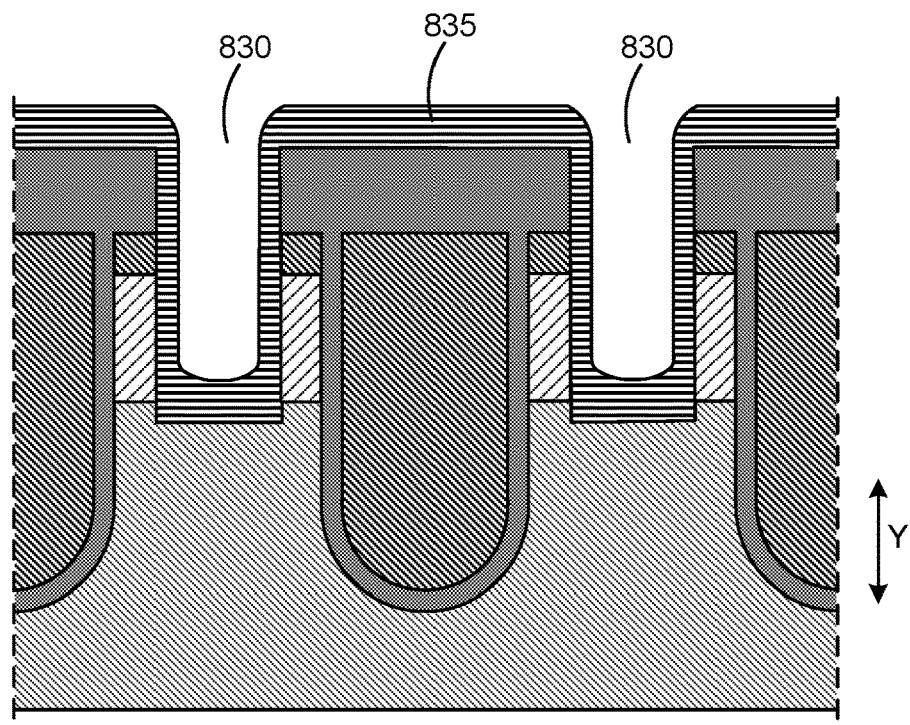

As illustrated in FIG. 8B, a dielectric layer (e.g., a reflowable oxide, such as a BSG) deposition process can be performed on the structure illustrated in FIG. 8A to form a reflowable dielectric fill layer 835, which can, as shown in FIG. 8B, fill the contact openings 830 and be disposed on an upper surface of the ILD 817. As shown in FIG. 8C, a reflow process can be performed to reflow the dielectric fill layer 835, such that a thickness of the dielectric fill layer 935 on the bottoms (bottom surfaces) of the contact openings 830 increases from its deposited thickness, such as shown in FIG. 8B.

Figure 8D:
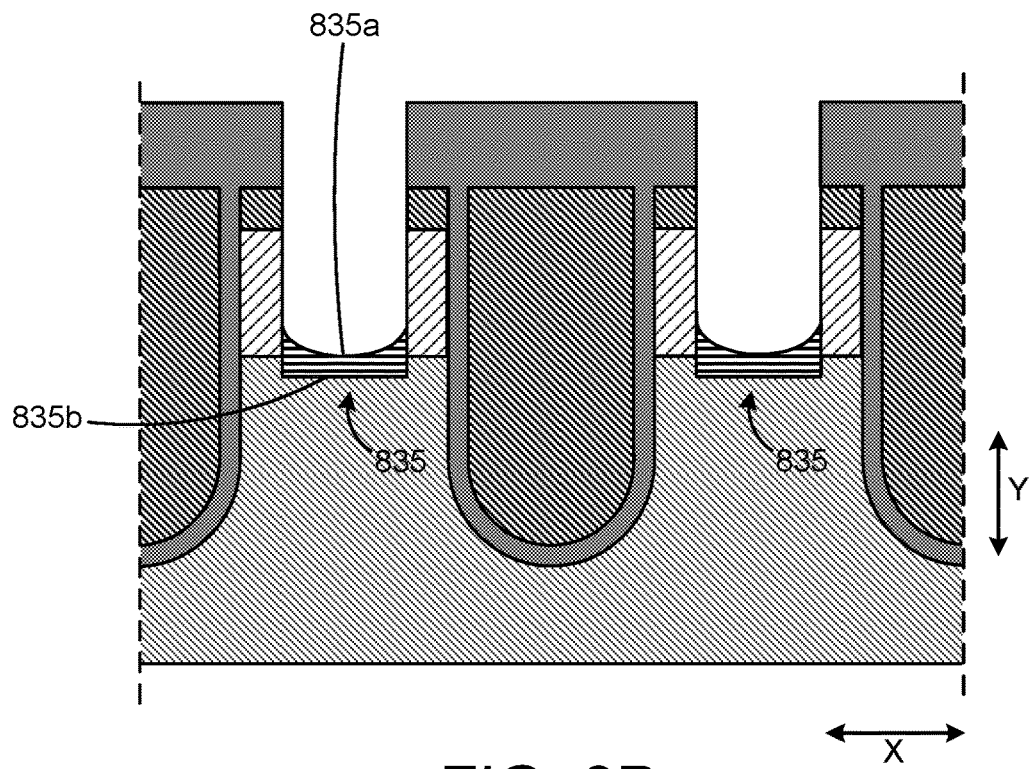

As shown in FIG. 8D, an etch process (e.g., a wet etch that is selectable to the reflowable dielectric fill layer 835) can be performed to remove a portion of the dielectric fill layer 835. In this example, the increased thickness of the dielectric fill layer 835 at the bottom of the contact opening (e.g., as a result of the reflow process of FIG. 8C) can allow for portions of the dielectric fill layer regions 835 to remain at the bottoms of the contact openings 830, while being removed elsewhere, such as shown in FIG. 8D. As also illustrated in FIG. 8D, each of the dielectric fill regions 835 remaining after this etch process can replace (fill, interrupt, intersect, etc.) at least a portion of the P-N junction of a respective built-in diode defined by an interface between a respective body (well) region 820 and the semiconductor region 810.

As also shown in FIG. 8D, each dielectric fill region 835 can have an upper surface 835a that is disposed, at least in part, above (vertically above) a P-N junction of a respective built in diode, and a bottom surface 835b that is below the P-N junction of the respective built-in diode. In other words, the upper surface 835a can be disposed, at least in part, at a depth below an upper surface of the semiconductor region 810 that is less than a depth of the P-N junction of the built in diode (e.g., the depth D in FIG. 1A), while the bottom surface 835b can be disposed at a depth below an upper surface of the semiconductor region 810 that is greater than the depth (e.g., the depth D) of the P-N junction of the built in diode. That is, each dielectric region 835 can extend through the P-N junction of a respective built-in diode, such that a portion of (part of an area of, etc.) the respective P-N junction is replaced (filled, interrupted, etc.) by the dielectric region 835.

Figure 8E:
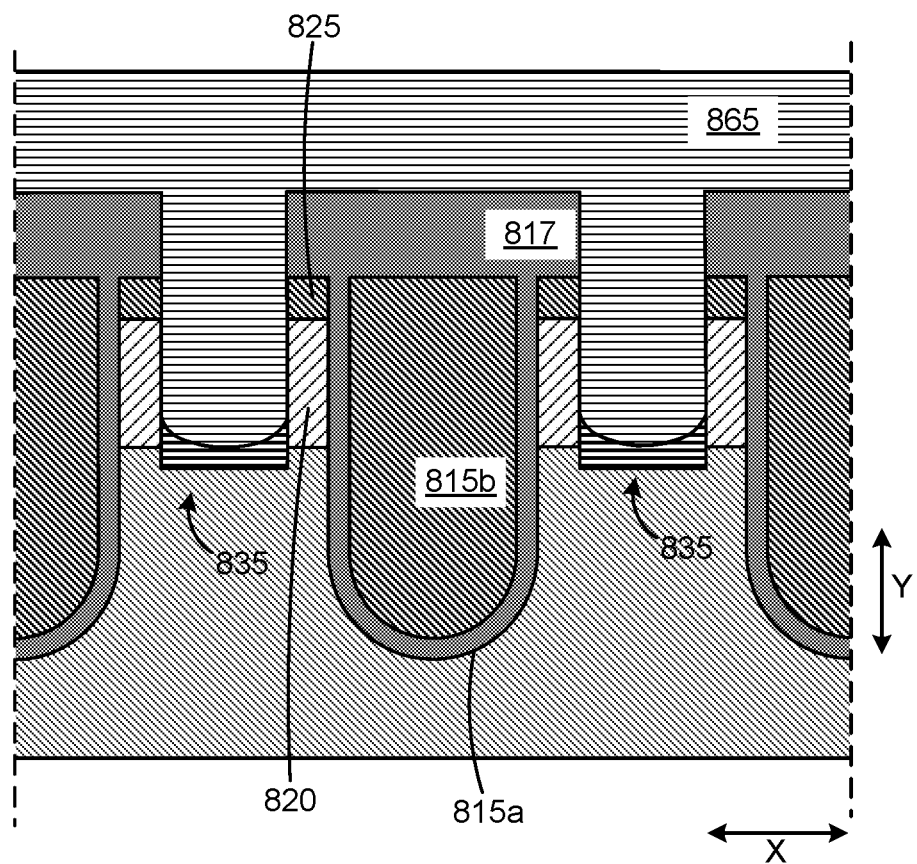

As shown in FIG. 8E, a metal deposition process can be performed on the structure shown in FIG. 8D to form a source metal (e.g., aluminum) layer 865 that is disposed in the contact openings 830 and on an upper surface of the ILD layer 817. As illustrated in FIG. 8E, the source metal layer 865 can electrically contact the body regions 820 and the source regions 825, such as along the sidewalls of the contact openings 830 and on the bottom of the contact openings 830, e.g., on each side of the dielectric regions 835, such as shown in FIG. 8E.

Figure 9A:
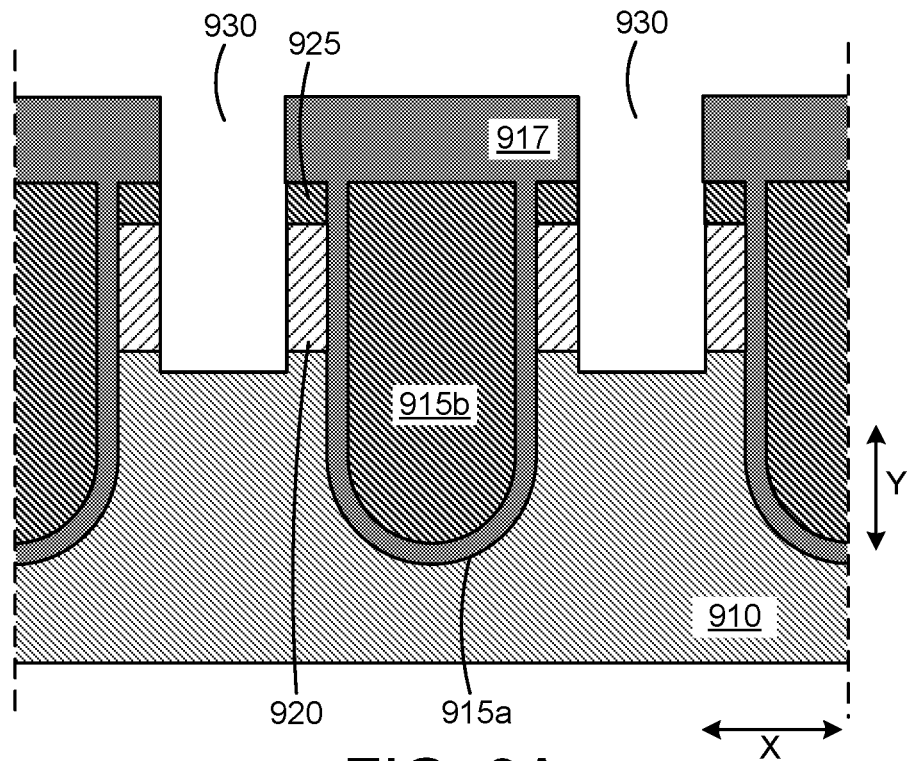
FIGS. 9A-9F are cross-sectional diagrams illustrating still another semiconductor process (e.g., process operations) for producing a partially dielectric filled MOSFET source contact.

FIGS. 9A-9F are cross-sectional diagrams illustrating operations of a another semiconductor process (e.g., processing operations, semiconductor processing operations, etc.) for producing a partially dielectric filled MOSFET source contact, so as to reduce a junction area of a built-in diode (e.g., defined by an interface between a P-type body region and an N-type semiconductor region). Referring to FIG. 9A, prior semiconductor processing operations have been performed to produce the structure shown. As shown in FIG. 9A, the resulting (in-process) MOSFET includes a semiconductor region 910 (e.g., an N-type epitaxial layer that can be disposed on an N-type semiconductor substrate).

The illustrated MOSFET of FIG. 9A also includes trench gates 915 (each including a gate dielectric 915a and a conductive gate electrode 915b), an ILD layer 917, body (P-type well) regions 920, source (N-type) regions 925 and contact openings 930. In some implementations, the contact openings 930 can be etched (e.g., using an isotropic etch) through a hard mask, such as discussed herein. As shown in FIG. 9A, similar to the structure shown in FIG. 8a, the contact openings 930 extend through the ILD 917, through the respective source regions 925, and through the respective body regions 920, such that the contact openings 930 terminate in the semiconductor region 910 below the respective body regions 920, as shown in FIG. 9A.

Figure 9B:
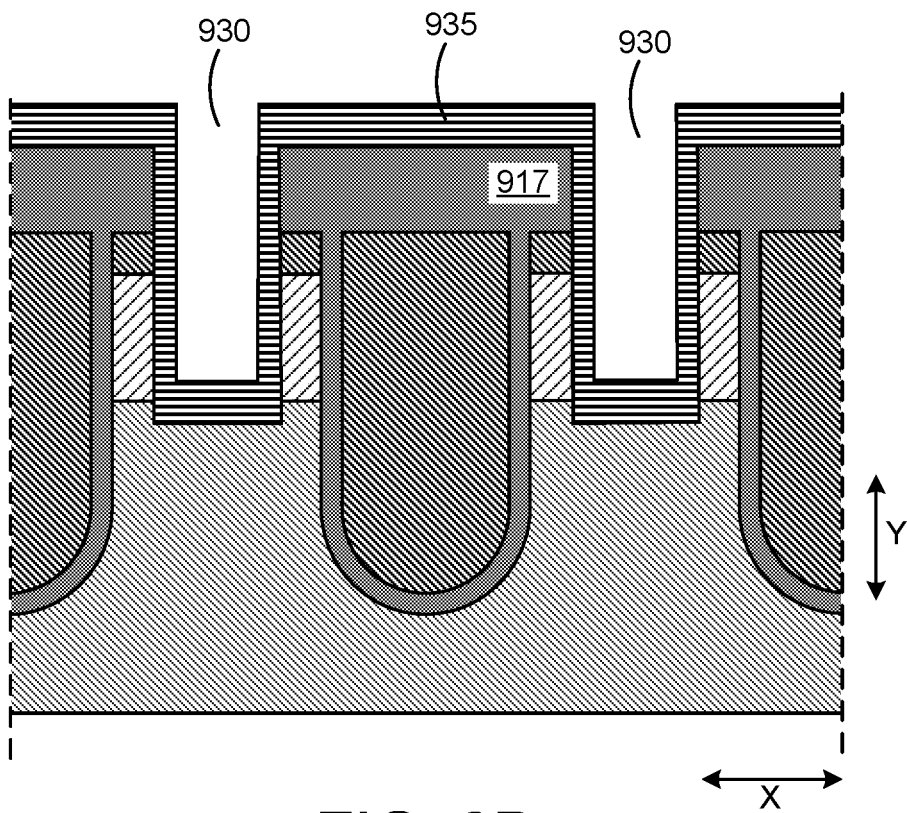
Figure 9C:
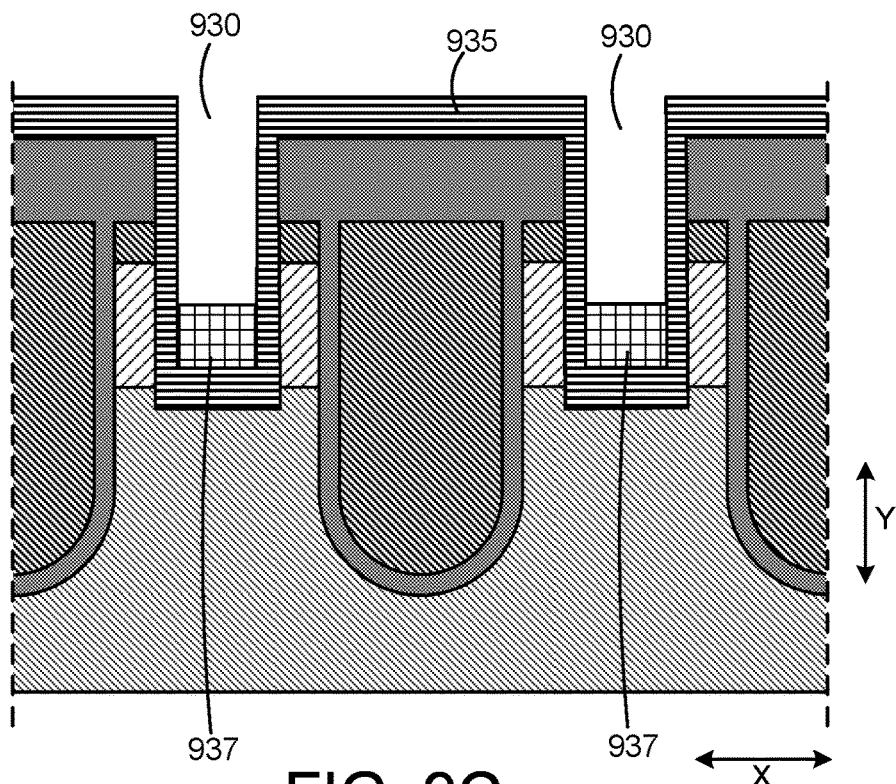

As illustrated in FIG. 9B, a dielectric layer (e.g., undoped silicon glass, tetraethyl orthosilicate, etc.) deposition process, which can include performing an oxide densification, can be performed on the structure illustrated in FIG. 9A to form a dielectric fill layer 935, which can, as shown in FIG. 9B, fill the contact openings 930 and be disposed on an upper surface of the ILD 917. As shown in FIG. 9C, an organic fill material 937 (e.g., a non-photoactive resist) can be deposited on the structure shown in FIG. 9B, and an etch process can be performed to recess the organic fill material 937 in the bottom of (on the bottom surface of) the contact openings 930, such as shown in FIG. 9C.

Figure 9D:
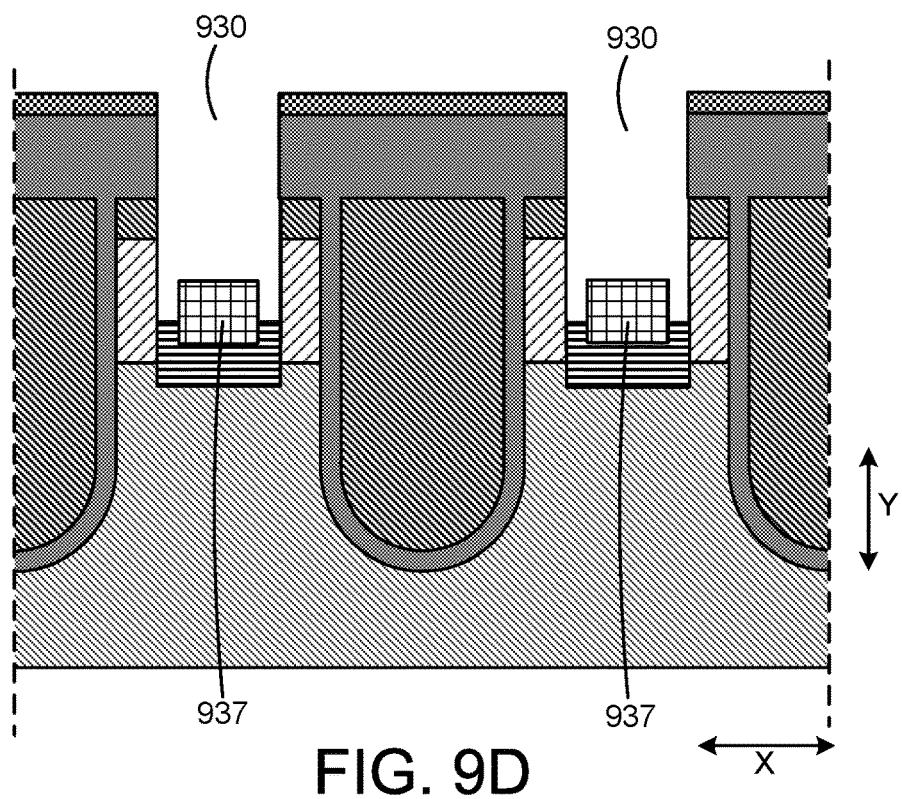

As shown in FIG. 9D, an etch process (e.g., an isotropic etch process) can be performed to remove a portion of the dielectric fill layer 935. In this example, the organic fill material 937 disposed the bottom of the contact openings 930 can act as a mask for the isotropic dielectric etch of FIG. 9D, which can allow for portions of the dielectric fill layer regions 935 to remain at the bottoms of the contact openings 930.

Figure 9E:
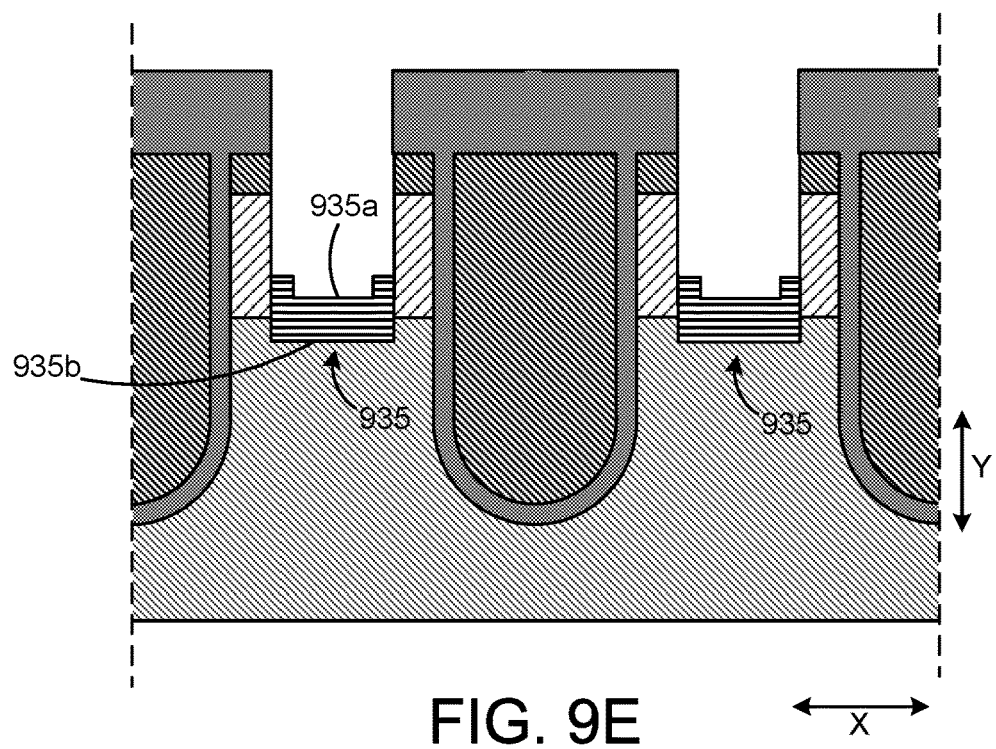

As shown in FIG. 9E, an organic fill material strip process (e.g., a photolithographic resist strip process) can be performed to remove the remaining organic fill material 937 from the contact openings, 930, such as shown in FIG. 9E. As also illustrated in FIG. 9E, each of the dielectric fill regions 935 remaining after this etch process can replace (fill, interrupt, intersect, etc.) at least a portion of the P-N junction of a respective built-in diode defined by an interface between a respective body (well) region 920 and the semiconductor region 910.

As also shown in FIG. 9E, each dielectric fill region 935 can have an upper surface 935a that is disposed, at least in part, above (vertically above) a P-N junction of a respective built in diode, and a bottom surface 935b that is below the P-N junction of the respective built-in diode. In other words, the upper surface 935a can be disposed, at least in part, at a depth below an upper surface of the semiconductor region 910 that is less than a depth of the P-N junction of the built in diode (e.g., the depth D in FIG. 1A), while the bottom surface 935b can be disposed at a depth below an upper surface of the semiconductor region 810 that is greater than the depth (e.g., the depth D) of the P-N junction of the built in diode. That is, each dielectric region 935 can extend through the P-N junction of a respective built-in diode, such that a portion of (part of an area of, etc.) the respective P-N junction is replaced (filled, interrupted, etc.) by the dielectric region 935.

Figure 9F:
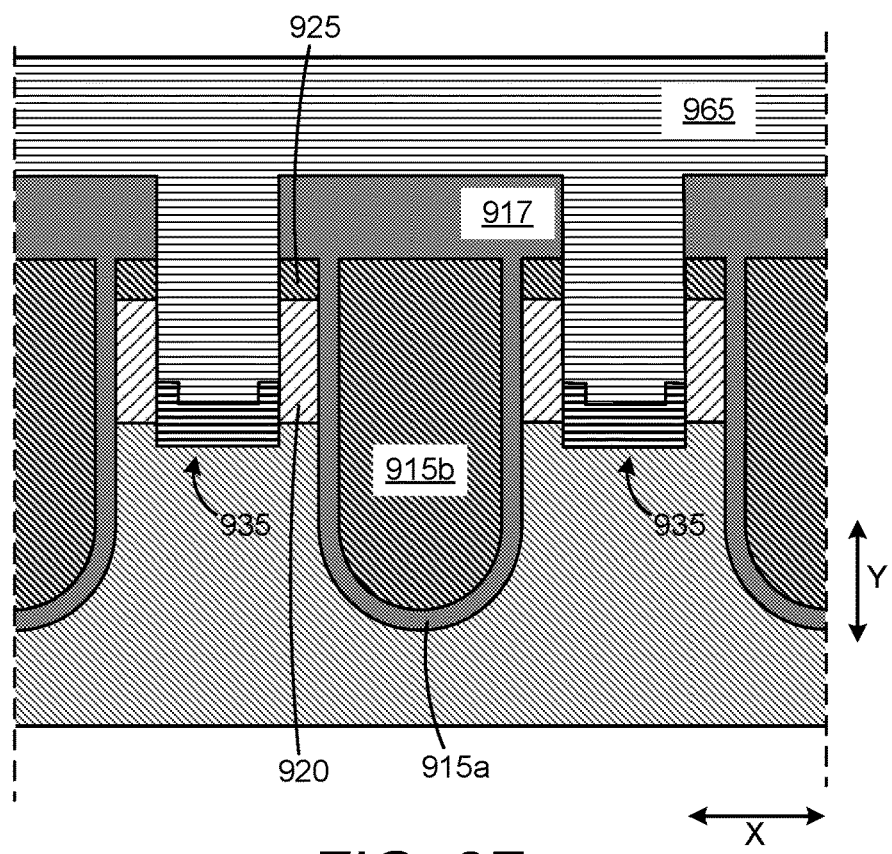

As shown in FIG. 9F, a metal deposition process can be performed on the structure shown in FIG. 9E to form a source metal (e.g., aluminum) layer 965 that is disposed in the contact openings 930 and on an upper surface of the ILD layer 917. As illustrated in FIG. 9F, the source metal layer 965 can electrically contact the body regions 920 and the source regions 925, such as along the sidewalls of the contact openings 930 and on the bottom of the contact openings 930, e.g., on each side of the dielectric regions 935, such as shown in FIG. 9F.

Figure 10:
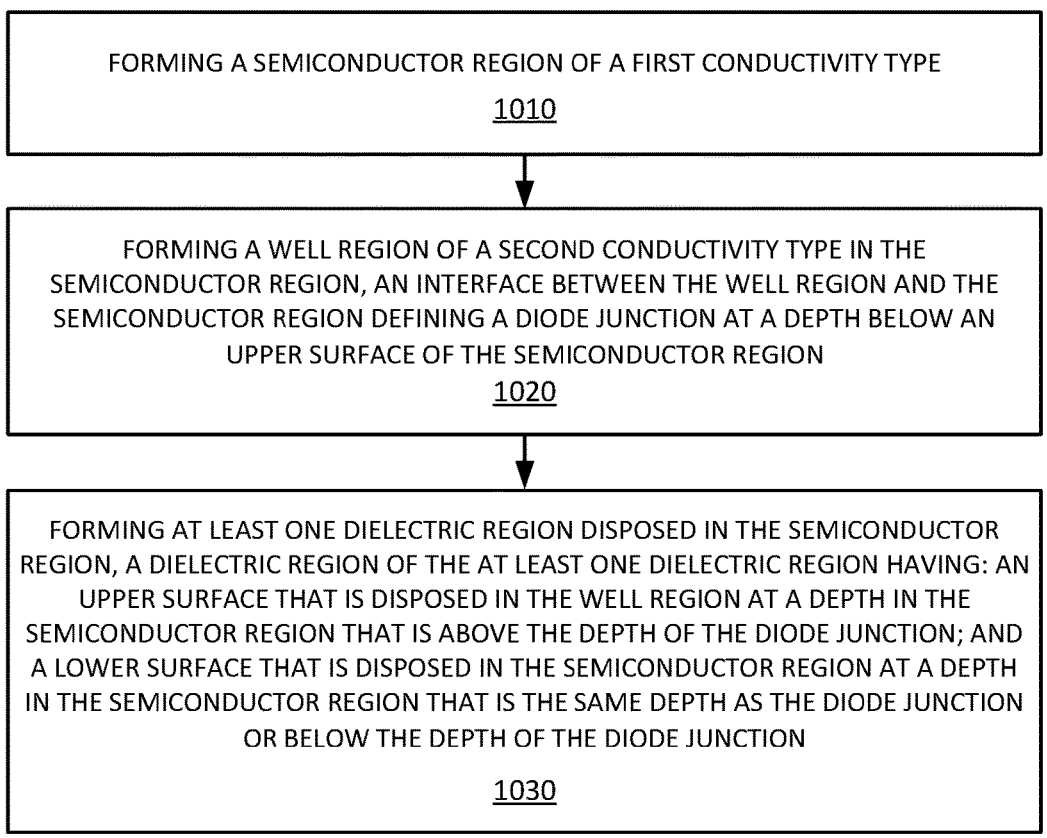
FIG. 10 is a flow chart illustrating a method for producing a semiconductor device.

FIG. 10 is a flow chart illustrating a method 1000 (e.g., a semiconductor processing method) that can be used to produce a semiconductor device, such as those devices described herein. In some implementations, the method 1000 can be implemented using the processing operations illustrated in, for example, FIGS. 6A-9F.

At block 1010, the method 1000 includes forming a semiconductor region of a first conductivity type, such as an epitaxial layer (e.g., the semiconductor regions 110, 310, 410, 610, 710, 810 or 910). At block 1020, the method 1000 includes forming a well region of a second conductivity type (e.g., the well, body and/or anode regions 120, 320, 420, 620, 720, 820 or 920) in the semiconductor region. An interface between the well region (block 1020) and the semiconductor region (block 1020) can define a diode junction at a depth below an upper surface of the semiconductor region. At block 1030, the method 1000 can include forming at least one dielectric region disposed in the semiconductor region. A dielectric region of the at least one dielectric region can have an upper surface that is disposed in the well region at a depth in the semiconductor region that is above the depth of the diode junction. The dielectric region can also have a lower surface that is disposed in the semiconductor region at a depth in the semiconductor region that is the same depth as the diode junction or below the depth of the diode junction.

In a general aspect, a semiconductor device can include a semiconductor region of a first conductivity type and a well region of a second conductivity type. The well region can be disposed in the semiconductor region. An interface between the well region and the semiconductor region can define a diode junction at a depth below an upper surface of the semiconductor region. The semiconductor device can also include at least one dielectric region disposed in the semiconductor region. A dielectric region of the at least one dielectric region can have an upper surface that is disposed in the well region at a depth in the semiconductor region that is above the depth of the diode junction. The dielectric region of the at least one dielectric region can have a lower surface that is disposed in the semiconductor region at a depth in the semiconductor region that is the same depth as the diode junction or below the depth of the diode junction.

Implementations can include one or more of the following features. For example, the dielectric region can interrupt a portion of the diode junction. The at least one dielectric region can include a plurality of dielectric regions, where each of the dielectric regions of the plurality of dielectric region interrupts a respective portion of the diode junction.

The semiconductor device can be a trench-gate metal-oxide-semiconductor field-effect transistor (MOSFET). The interface between the well region and the semiconductor region can be an interface between a body region of a metal-oxide-semiconductor field-effect transistor (MOSFET) and a drain region of the MOSFET. The dielectric region of the at least one dielectric region can be disposed in a bottom of a contact opening of the MOSFET. The MOSFET can be a trench-gate MOSFET.

The semiconductor device can be a rectifier. The interface between the well region and the semiconductor region can be an interface between an anode region of a P-intrinsic-N (P-i-N) diode and a cathode region of the P-i-N diode. The P-i-N diode can be included in the rectifier.

In another general aspect, a metal-oxide-semiconductor field-effect transistor (MOSFET) can include a semiconductor region of a first conductivity type. The semiconductor region can include a drift region of the MOSFET. The MOSFET can further include a body region of a second conductivity type disposed in the semiconductor region. An interface between the body region and the semiconductor region can define a diode junction at a depth below an upper surface of the semiconductor region. The MOSFET can also include a source region of the first conductivity type disposed in the body region and a contact opening disposed in the semiconductor region. The contact opening can extend through the source region and terminate in the body region. The MOSFET can still further include a dielectric region disposed at a bottom of the contact opening. The dielectric region can have a width that is less than a width of the bottom of the contact opening. The dielectric region can have an upper surface that is disposed in the contact opening at a depth in the semiconductor region that is above the depth of the diode junction. The dielectric region can also have a lower surface that is disposed in the semiconductor region at a depth in the semiconductor region that is the same depth as the diode junction or below the depth of the diode junction.

Implementations can include one or more of the following features. For example, the MOSFET can include a conductive metal layer disposed in the contact opening, the conductive metal layer can be disposed on the upper surface of the dielectric region and electrically contact the source region and the body region. The MOSFET can include a trench gate disposed in the semiconductor region. The trench gate can be laterally disposed from the contact opening and adjacent to the source region and the body region. The trench gate can include a trench disposed in the semiconductor region, a gate dielectric lining a sidewall of the trench and a bottom surface of the trench, and a conductive gate electrode disposed on the gate dielectric. The gate dielectric can electrically isolate the gate electrode from the source region, the body region and the semiconductor region.

The dielectric region can interrupt a portion of the diode junction. The at least one dielectric region can include a plurality of dielectric regions. Each of the dielectric regions of the plurality of dielectric regions can interrupt a respective portion of the diode junction. The dielectric region of the at least one dielectric region can include at least one of a grown oxide or a deposited oxide.

In another general aspect, a rectifier device can include a semiconductor region of a first conductivity type. The semiconductor region can include a cathode region of a P-intrinsic-N(P-i-N) diode of the rectifier device. The rectifier device can further include an anode region of a second conductivity type disposed in the semiconductor region. An interface between the anode region and the semiconductor region can define a diode junction at a depth below an upper surface of the semiconductor region. The rectifier device can still further include at least one dielectric region disposed in the semiconductor region. A dielectric region of the least one dielectric region can extend through the anode region and terminate in the cathode region.

Implementations can include one or more of the following features. For example, the rectifier device can include a metal layer disposed on the anode region. The metal layer can include a barrier metal layer disposed on the semiconductor region.

The dielectric region can interrupt a portion of the diode junction. The at least one dielectric region can include a plurality of dielectric regions. Each of the dielectric regions of the plurality of dielectric regions can interrupt a respective portion of the diode junction.

The dielectric region can include at least one of a grown oxide or a deposited oxide.

The various apparatus and techniques described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to (or laterally neighboring), vertically adjacent to (or vertically neighboring), or horizontally adjacent to (or horizontally neighboring), where neighboring can indicate that intervening element may be disposed between the elements being described as adjacent.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
   a semiconductor region of a first conductivity type;
   a well region of a second conductivity type, the well region being disposed in the semiconductor region, an interface between the well region and the semiconductor region defining a diode junction at a depth below an upper surface of the semiconductor region;
   an opening in the semiconductor region, the opening extending through the well region from the upper surface of the semiconductor region to the diode junction;
   a source region of a trench-gate metal-oxide-semiconductor field-effect transistor (MOSFET), the source region being disposed in the well region and adjacent to the opening in the semiconductor region;
   a dielectric region dispose in the opening in the semiconductor region, the dielectric region having:
   an upper surface that is disposed in the well region at a depth in the semiconductor region that is above the depth of the diode junction;
   a lower surface that is disposed in the semiconductor region at a depth in the semiconductor region that is a same depth as the diode junction or below the depth of the diode junction; and
   a first side surface and a second side surface, a distance between the first side surface and the second side surface defining a width of the dielectric region,
   a dielectric of the dielectric region:
   excluding a conductive electrode, and extending, at the depth of the diode junction, between the first side surface and the second side surface, and
   the width of the dielectric region between the first side surface and the second side surface, at the depth of the diode junction, defining an interruption in the diode junction; and
   a contact metal disposed in the opening in the semiconductor region, the contact metal being disposed on the dielectric region.

2. The semiconductor device of claim 1, wherein the dielectric region is one of a plurality of dielectric regions, each dielectric region of the plurality of dielectric regions interrupting a respective portion of the diode junction.

3. The semiconductor device of claim 1, wherein the interface between the well region and the semiconductor region is an interface between a body region of the trench-gate MOSFET and a drain region of the trench-gate MOSFET, the opening in the semiconductor region being a source and body contact opening of the trench-gate MOSFET.

4. The semiconductor device of claim 1, wherein the semiconductor device includes a rectifier.

5. The semiconductor device of claim 4, wherein the interface between the well region and the semiconductor region is an interface between an anode region of a P-intrinsic-N(P-i-N) diode and a cathode region of the P-i-N diode, the P-i-N diode being included in the rectifier.

6. A metal-oxide-semiconductor field-effect transistor (MOSFET), comprising:
   a semiconductor region of a first conductivity type, the semiconductor region including a drift region of the MOSFET;
   a body region of a second conductivity type disposed in the semiconductor region, an interface between the body region and the semiconductor region defining a diode junction at a depth below an upper surface of the semiconductor region;
   a source region of the first conductivity type disposed in the body region;
   a contact opening disposed in the semiconductor region, the contact opening extending through the source region and terminating in the body region;
   a dielectric region disposed at a bottom of the contact opening, the dielectric region having a width that is less than a width of the bottom of the contact opening, the dielectric region having:
   an upper surface that is disposed in the contact opening at a depth in the semiconductor region that is above the depth of the diode junction;
   a lower surface that is disposed in the semiconductor region at a depth in the semiconductor region that is a same depth as the diode junction or below the depth of the diode junction; and
   a first side surface and a second side surface, a distance between the first side surface and the second side surface defining the width of the dielectric region, a dielectric of the dielectric region excluding a conductive electrode and extending, at the depth of the diode junction, between the first side surface and the second side surface, and the width of the dielectric region between the first side surface and the second side surface defining, at the depth of the diode junction, an interruption in the diode junction; and a source and body contact of the MOSFET disposed in the contact opening, the source and body contact being disposed on the dielectric region.

7. The MOSFET of claim 6, further comprising a trench gate disposed in the semiconductor region, the trench gate being laterally disposed from the contact opening and adjacent to the source region and the body region.

8. The MOSFET of claim 7, wherein the trench gate includes:
   a trench disposed in the semiconductor region;
   a gate dielectric lining a sidewall of the trench and a bottom surface of the trench; and
   a conductive gate electrode disposed on the gate dielectric, the gate dielectric electrically isolating the conductive gate electrode from the source region, the body region and the semiconductor region.

9. The MOSFET of claim 6, wherein the dielectric region includes a plurality of dielectric regions, each dielectric region of the plurality of dielectric regions defining a respective discontinuity in the diode junction.

10. The MOSFET of claim 6, wherein the dielectric region includes at least one of a grown oxide or a deposited oxide.

* * * * *